US009952926B2

(12) United States Patent
Yen et al.

(10) Patent No.: US 9,952,926 B2
(45) Date of Patent: Apr. 24, 2018

(54) DECODING METHOD, MEMORY STORAGE DEVICE AND MEMORY CONTROL CIRCUIT UNIT

(71) Applicant: EpoStar Electronics Corp., Hsinchu (TW)

(72) Inventors: Heng-Lin Yen, Hsinchu County (TW); Yu-Hua Hsiao, Hsinchu County (TW)

(73) Assignee: EpoStar Electronics Corp., Hsinchu (TW)

( * ) Notice: Subject to any disclaimer, the term of this patent is extended or adjusted under 35 U.S.C. 154(b) by 0 days.

(21) Appl. No.: 15/208,618

(22) Filed: Jul. 13, 2016

(65) Prior Publication Data

US 2017/0337106 A1 Nov. 23, 2017

(30) Foreign Application Priority Data

May 23, 2016 (TW) ............................ 105115957 A

(51) Int. Cl.
*G06F 11/10* (2006.01)
*G11C 29/42* (2006.01)
*G11C 29/50* (2006.01)

(52) U.S. Cl.
CPC .......... *G06F 11/1072* (2013.01); *G11C 29/42* (2013.01); *G11C 29/50004* (2013.01); *G11C 2029/5004* (2013.01)

(58) Field of Classification Search
CPC ........... G06F 11/1072; G11C 29/50004; G11C 29/42; G11C 2029/5004; H03M 13/37; H03M 13/1111; H03M 13/458
See application file for complete search history.

(56) References Cited

U.S. PATENT DOCUMENTS 8,576,622 B2 * 11/2013 Yoon .................. G11C 11/5642 365/185.03
9,274,891 B2 * 3/2016 Lin .................... G06F 11/1072
(Continued)

OTHER PUBLICATIONS

D. h. Lee and W. Sung, "Decision Directed Estimation of Threshold Voltage Distribution in NAND Flash Memory," in IEEE Transactions on Signal Processing, vol. 62, No. 4, pp. 919-927, Feb. 15, 2014.*

(Continued)

*Primary Examiner* — Cynthia Britt
(74) *Attorney, Agent, or Firm* — JCIPRNET

(57) ABSTRACT

A decoding method, a memory storage device and a memory control circuit unit are provided. The decoding method includes: reading memory cells based on a default hard-decision voltage level and decoding the obtained hard-bit information; if the decoding fails, reading the memory cells based on default soft-decision voltage levels and then decoding the obtained soft-bit information; if the decoding still fails, reading the memory cells based on first test voltage levels to obtain first soft-bit information and reading the memory cells based on second test voltage levels to obtain second soft-bit information; obtaining a first estimating parameter and a second estimating parameter according to the first soft-bit information and the second soft-bit information, respectively; and updating the default hard-decision voltage level according to the first estimating parameter and the second estimating parameter. As a result, a decoding efficiency can be improved.

21 Claims, 14 Drawing Sheets

(56) References Cited

U.S. PATENT DOCUMENTS

| | | | | |
|---|---|---|---|---|
| 2009/0016140 | A1* | 1/2009 | Qureshi | G11O 5/147 365/227 |
| 2011/0038212 | A1* | 2/2011 | Uchikawa | G11C 11/5642 365/185.18 |
| 2015/0205664 | A1* | 7/2015 | Janik | G06F 11/1012 714/764 |
| 2016/0246673 | A1* | 8/2016 | Kim | H03M 13/3746 |
| 2016/0247576 | A1* | 8/2016 | Park | G11C 16/26 |
| 2016/0259683 | A1* | 9/2016 | Sakurada | H03M 13/45 |
| 2016/0266969 | A1* | 9/2016 | Jeon | G06F 11/1068 |
| 2016/0378596 | A1* | 12/2016 | Kim | G06F 11/1012 714/755 |
| 2017/0004038 | A1* | 1/2017 | Xia | G06F 11/1008 |

OTHER PUBLICATIONS

A. Prodromakis, G. Sklias and T. Antonakopoulos, “Emulating the aging of NAND Flash memories as a time-variant communications channel,” 2014 6th International Symposium on Communications, Control and Signal Processing (ISCCP), Athens, 2014, pp. 278-281.*

G. Dong, N. Xie and T. Zhang, “On the Use of Soft-Decision Error-Correction Codes in nand Flash Memory,” in IEEE Transactions on Circuits and Systems I: Regular Papers, vol. 58, No. 2, pp. 429-439, Feb. 2011.*

B. Peleato, R. Agarwal, J. M. Cioffi, M. Qin and P. H. Siegel, “Adaptive Read Thresholds for NAND Flash,” in IEEE Transactions on Communications, vol. 63, No. 9, pp. 3069-3081, Sep. 2015.*

* cited by examiner

| | Transition state region $R_{T1}$ | Transition state region $R_{T2}$ | Transition state region $R_{T3}$ |
|---|---|---|---|
| The number of memory cells | $N_1$ | $N_2$ | $N_3$ |
| Offset value | $+\Delta$ | $+2\Delta$ | $+3\Delta$ |

FIG. 10A

| | Transition state region $R_{S1}$ | Transition state region $R_{S2}$ | Transition state region $R_{S3}$ |
|---|---|---|---|
| The number of memory cells | $N'_1$ | $N'_2$ | $N'_3$ |
| Offset value | $+\Delta$ | $+2\Delta$ | $+3\Delta$ |

FIG. 10B

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 105115957, filed on May 23, 2016. The entirety of the above-mentioned patent application is hereby incorporated by reference herein and made a part of this specification.

BACKGROUND

Technical Field

The disclosure relates to a memory technology, and more particularly, to a decoding method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In general, after data is read from the memory, such data may be decoded in order to ensure an integrity of the data. Accordingly, if there is any error existing in the data, such error can be corrected through a decoding operation. Generally, a default read voltage level is usually configured in the memory device before leaving the factory. The default read voltage level is used for reading data stored in the memory device. However, with increases in usage time and/or wear level of the memory device, errors included in the data read by using the default read voltage level may become increasingly more and even go beyond control of an error correction capability of the decoding operation. Therefore, it is one of the important issues to be addressed by those skilled in the art as how to improve the correctness of the read data and/or a decoding capability of the memory by adjusting the default read voltage level.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure is directed to a decoding method, a memory storage device and a memory control circuit unit which are capable of improving a decoding efficiency.

An exemplary embodiment of the disclosure provides a decoding method, which is used for a rewritable non-volatile memory module including a plurality of memory cells. The decoding method includes: reading a plurality of first memory cells among the memory cells based on a default hard-decision voltage level to obtain hard-bit information; performing a hard-decoding operation on the hard-bit information; reading the first memory cells based on a plurality of default soft-decision voltage levels to obtain soft-bit information if the hard-decoding operation fails; performing a soft-decoding operation on the soft-bit information; reading the first memory cells based on a plurality of first test voltage levels to obtain first soft-bit information and reading the first memory cells based on a plurality of second test voltage levels to obtain second soft-bit information if the soft-decoding operation fails; obtaining a first estimating parameter according to the first soft-bit information and obtaining a second estimating parameter according to the second soft-bit information, wherein the first estimating parameter corresponds to a first total number of a memory cell matching a first state condition among the first memory cells, wherein the second estimating parameter corresponds to a second total number of a memory cell matching a second state condition among the first memory cells; and updating the default hard-decision voltage level according to the first estimating parameter and the second estimating parameter.

Another exemplary embodiment of the disclosure provides a memory storage device, which includes a connection interface unit, a rewritable non-volatile memory module and a memory control circuit unit. The connection interface unit is configured to couple to a host system. The rewritable non-volatile memory module includes a plurality of memory cells. The memory control circuit unit is coupled to the connection interface unit and the rewritable non-volatile memory module. The memory control circuit unit is configured to send a first read command sequence to instruct reading a plurality of first memory cells among the memory cells based on a default hard-decision voltage level to obtain hard-bit information. The memory control circuit unit is further configured to perform a hard-decoding operation on the hard-bit information. The memory control circuit unit is further configured to send a second read command sequence to instruct reading the first memory cells based on a plurality of default soft-decision voltage levels to obtain soft-bit information if the hard-decoding operation fails. The memory control circuit unit is further configured to perform a soft-decoding operation on the soft-bit information. The memory control circuit unit is further configured to send a first test command sequence to instruct reading the first memory cells based on a plurality of first test voltage levels to obtain first soft-bit information and send a second test command sequence to instruct reading the first memory cells based on a plurality of second test voltage levels to obtain second soft-bit information if the soft-decoding operation fails. The memory control circuit unit is further configured to obtain a first estimating parameter according to the first soft-bit information and obtain a second estimating parameter according to the second soft-bit information. The first estimating parameter corresponds to a first total number of a memory cell matching a first state condition among the first memory cells. The second estimating parameter corresponds to a second total number of a memory cell matching a second state condition among the first memory cells. The memory control circuit unit is further configured to update the default hard-decision voltage level according to the first estimating parameter and the second estimating parameter.

Another exemplary embodiment of the disclosure provides a memory control circuit unit, which is configured to control a rewritable non-volatile memory module having a plurality of memory cells. The memory control circuit unit includes a host interface, a memory interface, an error checking and correcting circuit, and a memory management circuit. The host interface is configured to couple to a host system. The memory interface is configured to couple to the rewritable non-volatile memory module. The memory management circuit is coupled to the host interface, the memory interface and the error checking and correcting circuit. The memory management circuit is configured to send a first read command sequence to instruct reading a plurality of first memory cells among the memory cells based on a default hard-decision voltage level to obtain hard-bit information. The error checking and correcting circuit is configured to perform a hard-decoding operation on the hard-bit information. The memory management circuit is further configured to send a second read command sequence to instruct reading the first memory cells based on a plurality of default soft-decision voltage levels to obtain soft-bit information if the hard-decoding operation fails. The error checking and correcting circuit is further configured to perform a soft-decoding operation on the soft-bit information. The memory management circuit is further configured to send a first test command sequence to instruct reading the first memory cells based on a plurality of first test voltage levels to obtain first soft-bit information and send a second test command sequence to instruct reading the first memory cells based on a plurality of second test voltage levels to obtain second soft-bit information if the soft-decoding operation fails. The memory management circuit is further configured to obtain a first estimating parameter according to the first soft-bit information and obtain a second estimating parameter according to the second soft-bit information. The first estimating parameter corresponds to a first total number of a memory cell matching a first state condition among the first memory cells. The second estimating parameter corresponds to a second total number of a memory cell matching a second state condition among the first memory cells. The memory management circuit is further configured to update the default hard-decision voltage level according to the first estimating parameter and the second estimating parameter.

Based on the above, after the soft-decoding operation fails, at least two groups of test voltage levels are used to read the same memory cells. Then, the corresponding estimating parameters are obtained, where each of the estimating parameters corresponds to the total number of the memory cells matching one specific state condition among the memory cells. The default hard-decision voltage level may be updated according to the estimating parameters. As a result, an decoding efficiency can be improved.

To make the above features and advantages of the disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 10A is a schematic diagram illustrating a correspondence relation between the number of the memory cells and the offset value according to an exemplary embodiment of the disclosure.

FIG. 10B is a schematic diagram illustrating a correspondence relation between the number of the memory cells and the offset value according to another exemplary embodiment of the disclosure.

DESCRIPTION OF THE EMBODIMENTS

Figure 1:
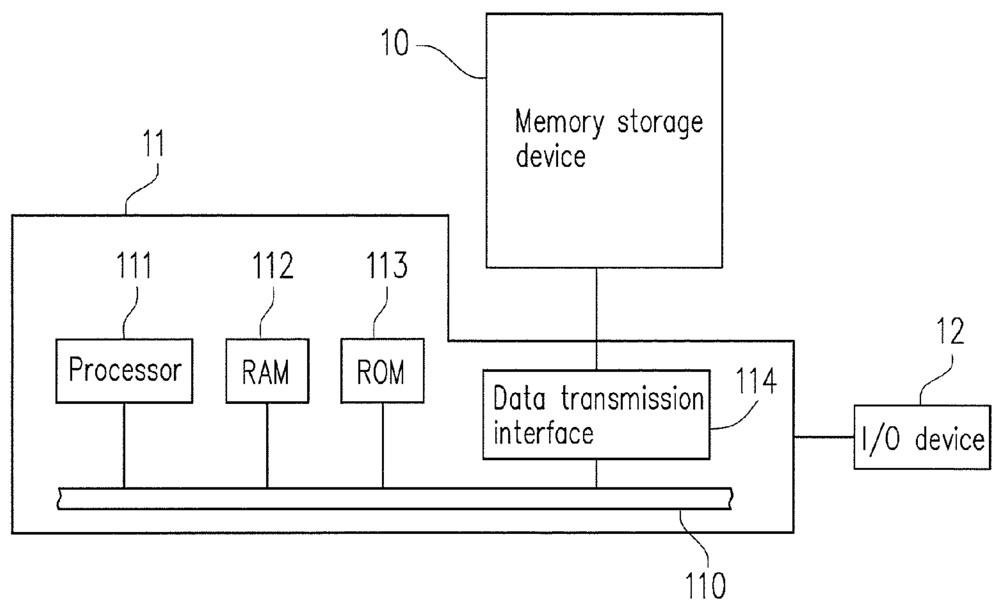
FIG. 1 is a schematic diagram illustrating a host system, a memory storage device and an I/O (input/output) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, the memory storage device (also known as a memory storage system) includes a rewritable non-volatile memory module and a controller (also known as a control circuit). The memory storage device is usually configured to cooperate with a host system so the host system may write data into the memory storage device or receive data from the memory storage device.

Figure 2:
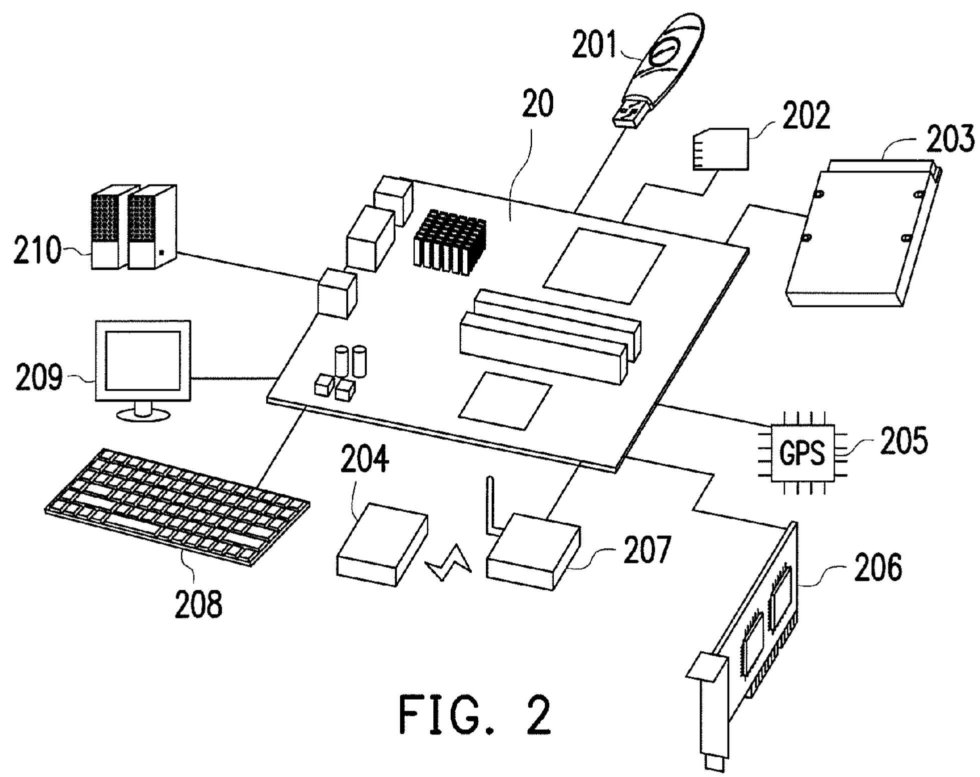
FIG. 2 is a schematic diagram illustrating a host system, a memory storage device and an I/O device according to another exemplary embodiment of the disclosure.

FIG. 1 is a schematic diagram illustrating a host system, a memory storage device and an I/O (input/output) device according to an exemplary embodiment of the disclosure. FIG. 2 is a schematic diagram illustrating a host system, a memory storage device and an I/O device according to another exemplary embodiment of the disclosure.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 through the system bus 110. For example, the host system 11 can transmit output signals to the I/O device 12 or receive input signals from the I/O device 12 through the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices, such as a GPS (Global Positioning System) module 205, a network interface card 206, a wireless transmission device 207, a keyboard 208, a monitor 209 and/or a speaker 210 through the system bus 110. For example, in an exemplary embodiment, the main board 20 may access the wireless memory storage device 204 through the wireless transmission device 207.

Figure 3:
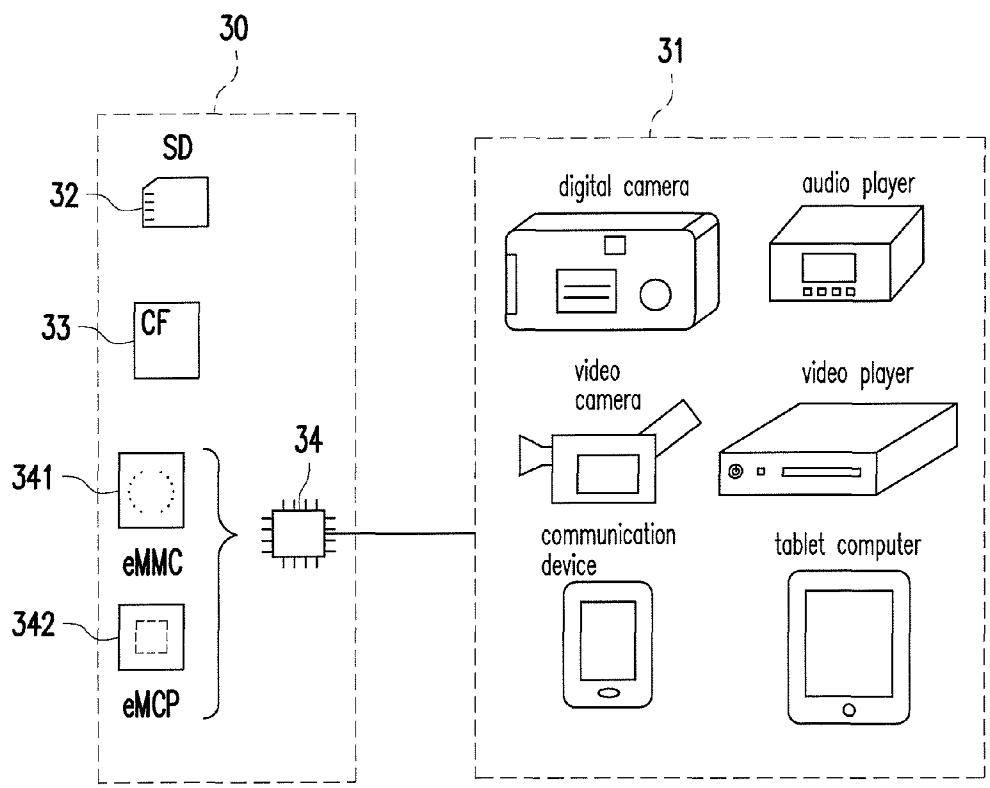
FIG. 3 is a schematic diagram illustrating a host system and a memory storage device according to another exemplary embodiment of the disclosure.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the disclosure. Referring to FIG. 3, in another exemplary embodiment, a host system 31 may also be a system, such as a digital camera, a video camera, a communication device, an audio player, a video player or a tablet computer, whereas a memory storage device 30 may be various non-volatile memory storage devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) storage device 342.

Figure 4:
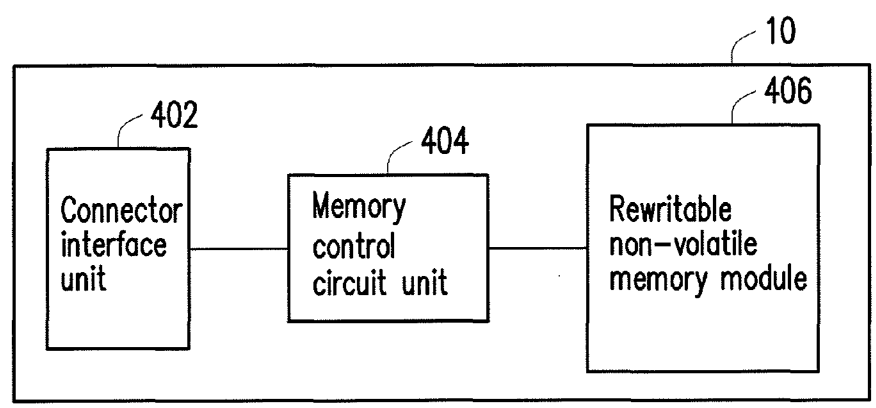
FIG. 4 is a schematic block diagram illustrating a memory storage device according to an exemplary embodiment of the disclosure.

FIG. 4 is a schematic block diagram illustrating a memory storage device according to an exemplary embodiment of the disclosure.

Referring to FIG. 4, the memory storage device 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the disclosure is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 may be distributed outside of a chip including the memory control circuit unit 404.

The memory control circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage is also known as "writing data into the memory cell" or "programming the memory cell". Each of the memory cells in the rewritable non-volatile memory module 406 has a plurality of storage states depended on changes in the threshold voltage. The storage state to which the memory cell belongs may be determined by applying a read voltage to the memory cell, so as to obtain the one or more bits stored in the memory cell.

Figure 5:
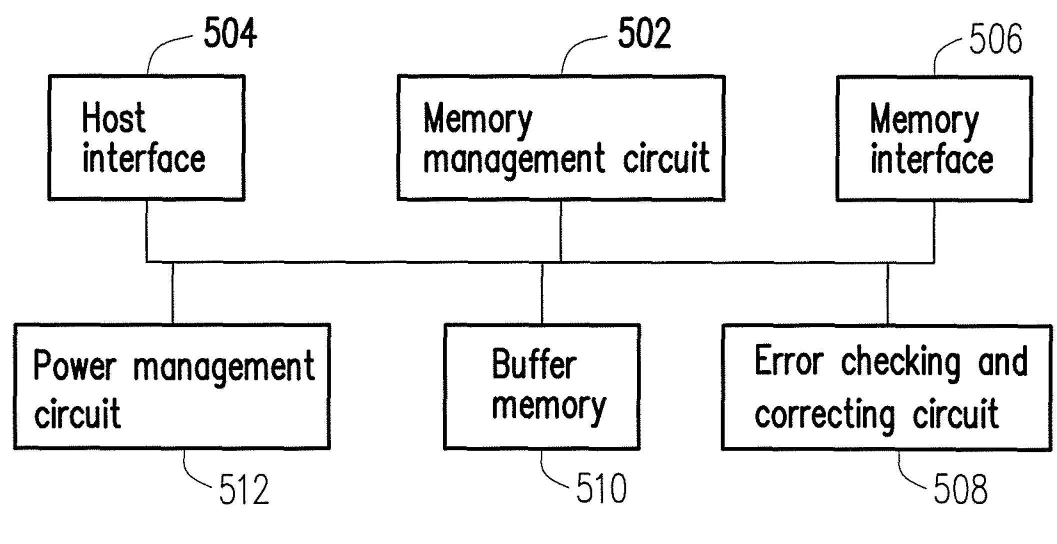
FIG. 5 is a schematic block diagram illustrating a memory control circuit unit according to an exemplary embodiment of the disclosure.

FIG. 5 is a schematic block diagram illustrating a memory control circuit unit according to an exemplary embodiment of the disclosure.

Referring to FIG. 5, the memory control circuit unit 404 includes a memory management circuit 502, a host interface 504, a memory interface 506 and an error checking and correcting circuit 508.

The memory management circuit 502 is configured to control overall operations of the memory control circuit unit 404. Specifically, the memory management circuit 502 has a plurality of control commands and the control commands are executed to perform various operations such as writing, reading and erasing data during operation of the memory storage device 10. Hereinafter, operations of the memory management circuit 502 are described as equivalent to describing operations of the memory control circuit unit 404.

In the present exemplary embodiment, the control commands of the memory management circuit 502 are implemented in form of firmware. For instance, the memory management circuit 502 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations, such as writing, reading or erasing data.

Further, in another exemplary embodiment, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to issue a write command sequence for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 502 may further issue command sequence of other types to the rewritable non-volatile memory module 406 for instructing to perform the corresponding operations.

The host interface 504 is coupled to the memory management circuit 502 and configured to receive and identify commands and data sent from the host system 11. In other words, the commands and data transmitted by the host system 11 are transmitted to the memory management circuit 502 through the host interface 504. In the present exemplary embodiment, the host interface 504 is compatible with the SATA standard. However, it should be understood that the present disclosure is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written to the rewritable non-volatile memory module 406 is converted into a format acceptable by the rewritable non-volatile memory module 406 through the memory interface 506. Specifically, if the memory management circuit 502 intends to access the rewritable non-volatile memory module 406, the memory interface 506 sends corresponding command sequences. For example, the command sequences may include the write command sequence which instructs to read data, the read command sequence which instructs to read data, the erase command sequence which instructs to erase data, and other command sequences configured to instruct performing various memory operations (e.g., changing a read voltage level or performing a garbage collection procedure). These command sequences are generated by the memory management circuit 502 and transmitted to the rewritable non-volatile memory module 406 through the memory interface 506, for example. The command sequences may include one or more signals, or data transmitted in the bus. The signals or the data may include command codes and program codes. For example, information such as identification codes and memory addresses are included in the read command sequence.

The error checking and correcting circuit 508 is coupled to the memory management circuit 502 and configured to perform an error checking and correcting operation to ensure the correctness of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data corresponding to the write command and the corresponding ECC and/or the EDC into the rewritable non-volatile memory module 406. Then, when the memory management circuit 502 reads the data from the rewritable non-volatile memory module 406, the corresponding ECC and/or the EDC are also read, and the error checking and correcting circuit 508 performs the error checking and correcting operation on the read data based on the ECC and/or the EDC.

In the present exemplary embodiment, the error checking and correcting circuit 508 encodes and decodes based on a low density parity check (LDPC) code. However, in another exemplary embodiment, the error checking and correcting circuit 508 may also encode and decode based on various codes such as a BCH code, a convolutional code, a turbo code or so on. For those skilled in the art, encoding and decoding data by using any of above codes belongs to a common knowledge, and thus related description is omitted hereinafter.

In an exemplary embodiment, the memory control circuit unit 404 further includes a buffer memory 510 and a power management circuit 512.

The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

Figure 6:
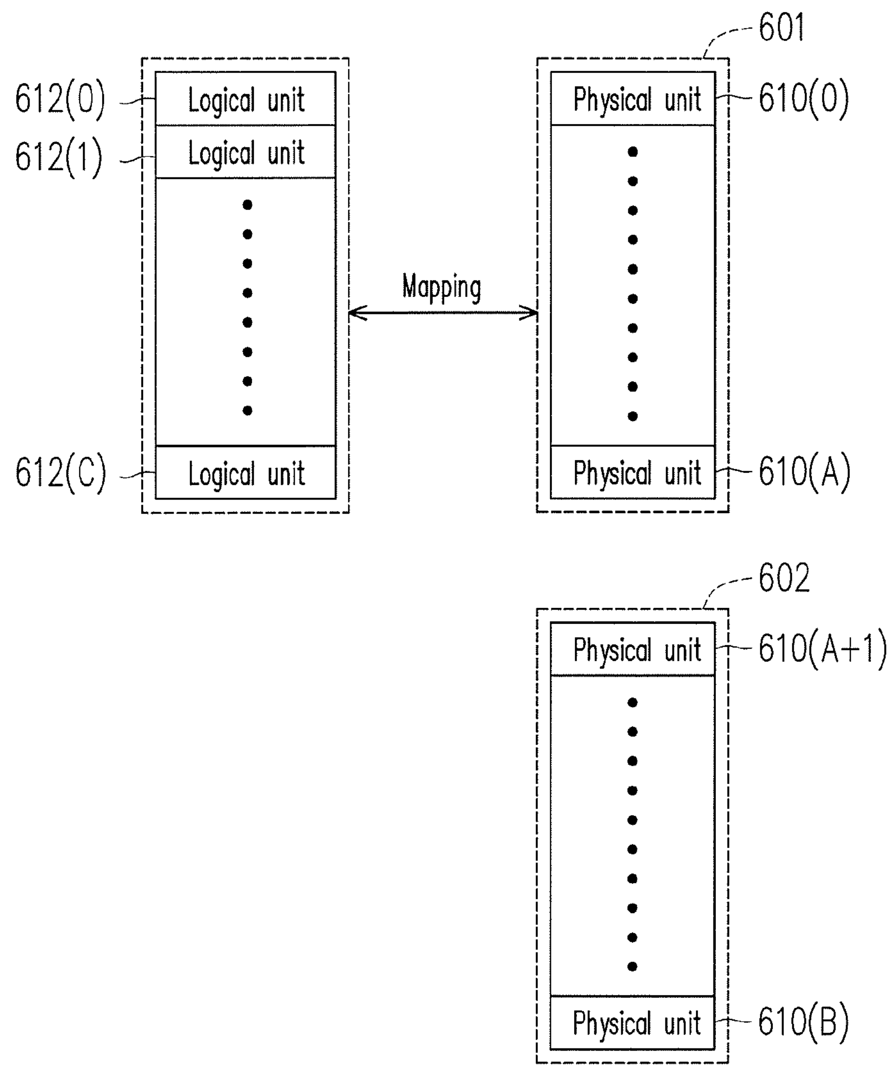
FIG. 6 is a schematic diagram illustrating management of a rewritable non-volatile memory module according to an exemplary embodiment of the disclosure.

FIG. 6 is a schematic diagram illustrating management of a rewritable non-volatile memory module according to an exemplary embodiment of the disclosure. It should be understood that terms, such as "select" and "group", are logical concepts which describe operations in the physical units of the rewritable non-volatile memory module 406. That is to say, the physical units of the rewritable non-volatile memory module 406 are logically operated while actual locations of the physical units of the rewritable non-volatile memory module 406 remain unchanged.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store more than one bit, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is a minimum unit for programming. That is, the physical programming unit is the minimum unit for writing data. For example, the physical programming unit is a physical page or a physical sector. When the physical programming unit is the physical page, the physical programming unit usually includes a data bit area and a redundancy bit area. The data bit area includes multiple physical sectors configured to store user data, and the redundant bit area is configured to store system data (e.g., an error correcting code). In the present exemplary embodiment, the data bit area includes 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

Referring to FIG. 6, the memory management circuit 502 logically groups physical units 610(0) to 610(B) of the rewritable non-volatile memory module 406 into a storage area 601 and a replacement area 602. The physical units 610(0) to 610(A) in the storage area 601 are configured to store data, and the physical units 610(A+1) to 610(B) in the replacement area 602 are configured to replace damaged physical units in the storage area 601. For example, the physical units are replaced by using one physical erasing unit as a unit. In the present exemplary embodiment, each of the physical units 610(0) to 610(B) refers to at least one physical programming unit. Alternatively, in another exemplary embodiment, each of the physical units 610(0) to 610(B) may also include any number of the memory cells.

The memory management circuit 502 configures logical units 612(0) to 612(C) for mapping at least a part of the physical units 610(0) to 610(A) in the storage area 601. In the present exemplary embodiment, the host system 11 accesses the data stored in the storage area 601 through a logical address (LA). Therefore, each of the logical units 612(0) to 612(C) refers to one logical address. However, in another exemplary embodiment, each of the logical units 612(0) to 612(C) may also refer to one logical programming unit, one logical erasing unit or a composition of a plurality of consecutive or non-consecutive logical addresses, depending on practical requirements. In addition, each of the logical units 612(0) to 612(C) may also be mapped to one or more physical units.

In the present exemplary embodiment, the memory management circuit 502 records a mapping relation (also known as a logical-physical mapping relation) between the logical units and the physical units into at least one logical-physical mapping table. When the host system 11 intends to read the data from the memory storage device 10 or write the data into the memory storage device 10, the memory management circuit 502 may access the data in the memory storage device 10 according to the logical-physical mapping table.

Figure 7:
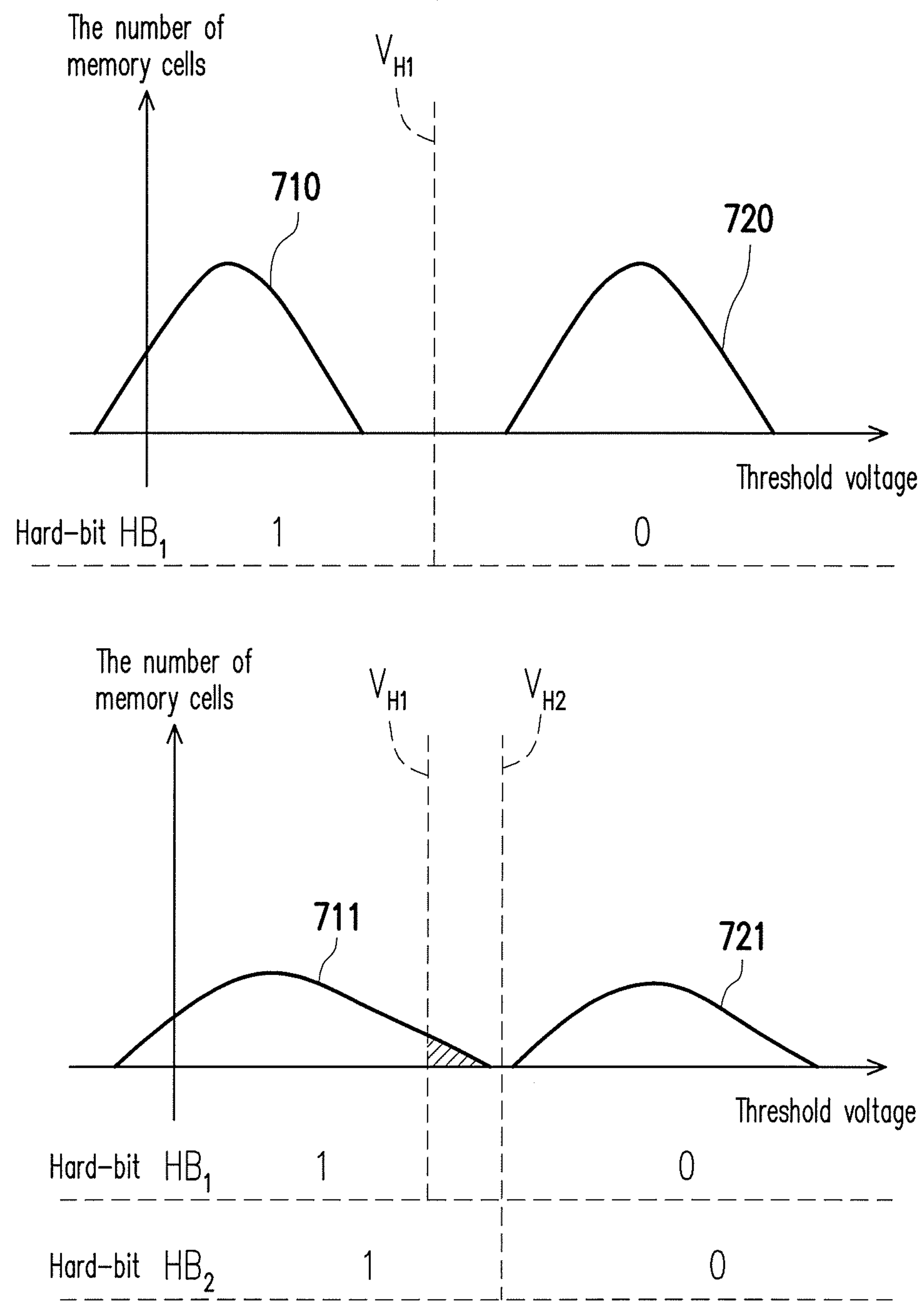
FIG. 7 illustrates a schematic diagram for reading hard-bit information according to an exemplary embodiment of the disclosure.

FIG. 7 illustrates a schematic diagram for reading hard-bit information according to an exemplary embodiment of the disclosure. The SLC NAND flash memory is taken as an example in the present exemplary embodiment, where a horizontal axis represents the threshold voltage of the memory cells, and a vertical axis represents a number of the memory cells. However, in another exemplary embodiment, FIG. 7 may also be used to represent a part of threshold voltage distributions in the MLC NAND or TLC NAND flash memories.

Referring to FIG. 7, after a plurality of memory cells (hereinafter, also known as first memory cells) in the rewritable non-volatile memory module 406 is programmed, the threshold voltage of each of the programmed memory cells belongs to one of distributions 710 and 720. For example, if one specific memory cell is used to store the bit "1", the threshold voltage of the specific memory cell falls within the distribution 710; if one specific memory cell is used to store the bit "0", the threshold voltage of the specific memory cell falls within the distribution 720.

It is noted that, in the present exemplary embodiment, each memory cell is configured to store one bit, and thus the threshold voltages of the memory cells can fall within two possible distributions (e.g., the distributions 710 and 720). However, in other exemplary embodiments, if one memory cell is configured to store a plurality of bits, the corresponding threshold voltages can fall within four (e.g., the MLC NAND flash memory), eight (e.g., the TLC NAND flash memory), or any other number of possible distributions. In addition, the bit(s) represented by each distribution is not particularly limited in the disclosure. For example, in another exemplary embodiment of FIG. 7, the distribution 710 may represent the bit “0”, and the distribution 720 may represent the bit “1”.

Generally, when intending to read data stored in the first memory cells, the memory management circuit 502 sends a read command sequence (hereinafter, also known as a first read command sequence) to the rewritable non-volatile memory module 406. The first read command sequence is configured to instruct reading data from physical addresses of the first memory cells based on a voltage level. In an exemplary embodiment, this voltage level is also known as a default hard-decision voltage level. According to this read command sequence, the rewritable non-volatile memory module 406 applies a read voltage (e.g., a voltage level $V_{H1}$) to the first memory cells and transmit the obtained data to the memory management circuit 502. In this case, the voltage level $V_{H1}$ is the default hard-decision voltage level. If the threshold voltage of one specific memory cell is less than the applied voltage level $V_{H1}$ (e.g., the memory cell has a threshold voltage belonging to the distribution 710), the memory management circuit 502 reads the bit “0”. If the threshold voltage of one specific memory cell is greater than the applied voltage level $V_{H1}$ (e.g., the memory cell has a threshold voltage belonging to the distribution 720), the memory management circuit 502 reads the bit “0”.

However, with increases in usage time of the rewritable non-volatile memory module 406, a performance degradation may occur on the memory cells in the rewritable non-volatile memory module 406. For example, after the performance degradation has occurred on the memory cells belonging to the distributions 710 and 720, the distributions 710 and 720 may gradually move close to each other or even overlap with each other. For example, a distribution 711 and a distribution 721 in FIG. 7 are used to represent the distributions 710 and 720 respectively after the performance degradation has occurred. After the performance degradation has occurred, if the first memory cells are continuously used to store data and the same default hard-decision voltage level (e.g., the voltage level $V_{H1}$) is used to read the first memory cells, the read data may include a lot of errors. Taking the distributions 711 and 721 in FIG. 7 for example, although the memory cells within a slash region still belong to the distribution 711, their threshold voltages are already higher than the voltage level $V_{H1}$. Therefore, if the voltage level $V_{H1}$ is continuously used to read the first memory cells, a part of the memory cells actually stored with the bit “1” (e.g., the memory cells within the slash area in the distribution 711) may be misjudged as storing the bit “0”.

Hence, after the data is read based on the default hard-decision voltage level (e.g., the voltage level $V_{H1}$), the error checking and correcting circuit 508 decodes the data so as to attempt correcting possible errors in the data. Herein, the data read based on the hard-decision voltage level is also known as hard-bit information (e.g., a hard-bit $HB_1$ in FIG. 7), and an operation of decoding the hard-bit information is also known as a hard-decoding operation. Those skilled in the art should be able to understand how the error checking and correcting circuit 508 uses the LDPC code or the like to perform the hard-decoding operation and what hardware structure is required by the error checking and correcting circuit 508 in order to complete the hard-decoding operation. For example, the hard-decoding operation may include a parity check operation for generating a syndrome and a bit flipping algorithm, a min-sum algorithm and/or a sum-product algorithm for determining error bits. Then, the error checking and correcting circuit 508 determines whether the performed hard-decoding operation succeeds (or fails). If the hard-decoding operation succeeds (e.g., all errors in the data are corrected), the error checking and correcting circuit 508 may output successfully-decoded data. If the hard-decoding operation fails (e.g., errors in the data cannot be completely corrected), the error checking and correcting circuit 508 enters a soft-decoding mode.

In the soft-decoding mode, the memory management circuit 502 sends another read command sequence (hereinafter, also known as a second read command sequence) to instruct reading data from the first memory cells based on a plurality of voltage levels. In an exemplary embodiment, those voltage levels are also known as default soft-decision voltage levels. For example, those default soft-decision voltage levels correspond to the default hard-decision voltage level previously used. According to the second read command sequence, the rewritable non-volatile memory module 406 sequentially applies a plurality of read voltages to the first memory cells and return the obtain data to the memory management circuit 502.

Figure 8:
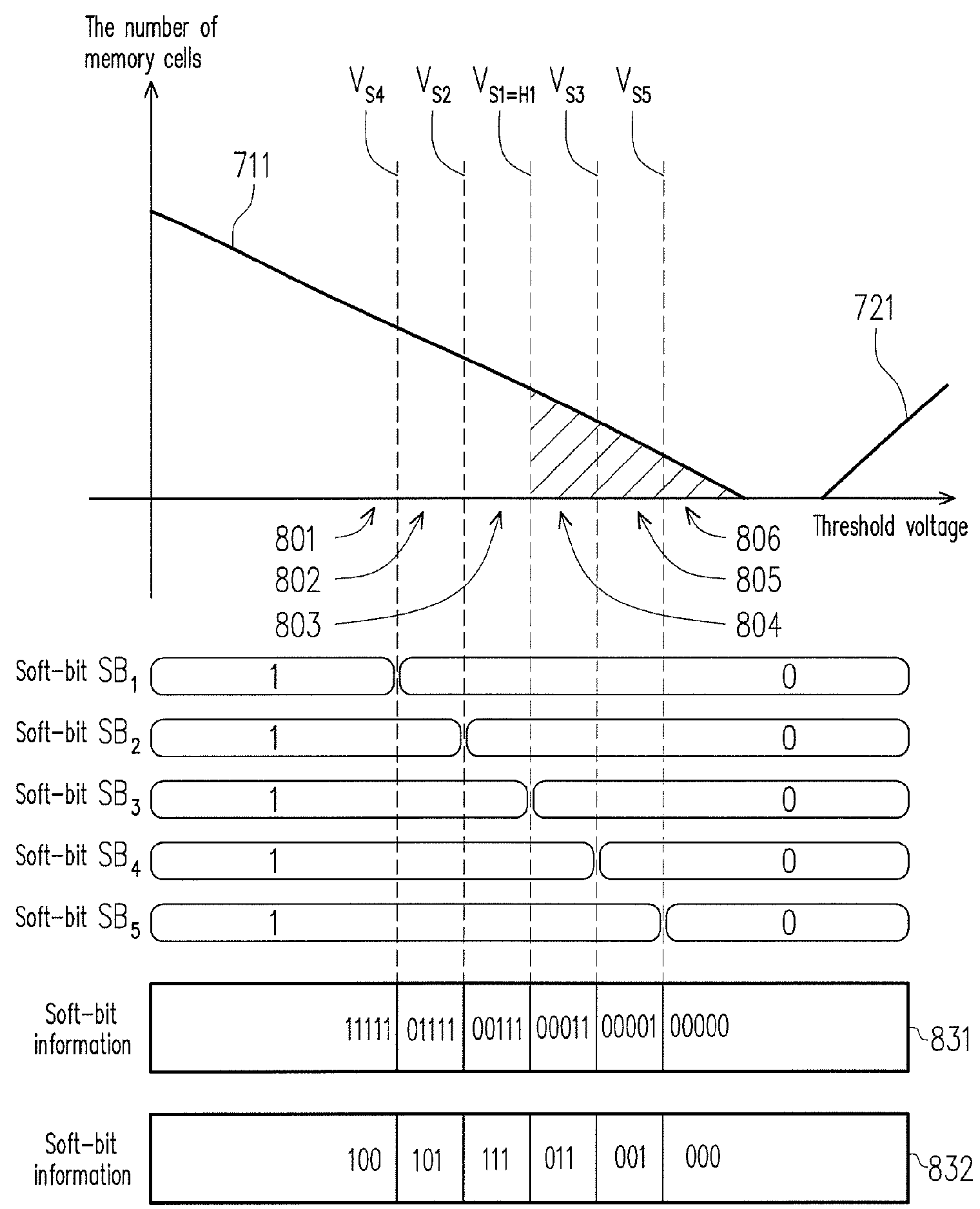
FIG. 8 illustrates a schematic diagram for reading soft-bit information according to an exemplary embodiment of the disclosure.

FIG. 8 illustrates a schematic diagram for reading soft-bit information according to an exemplary embodiment of the disclosure.

Referring to FIG. 8 as continuation to the exemplary embodiment of FIG. 7, in the soft-decoding mode, the rewritable non-volatile memory module 406 sequentially reads the first memory cells based on a plurality of default soft-decision voltage levels (e.g., voltage levels $V_{S1}$ to $V_{S5}$) and return the obtained data. The voltage levels $V_{S1}$ to $V_{S5}$ may be used in arbitrary sequence. After one of the first memory cells is read based on the voltage levels $V_{S1}$ to $V_{S5}$, if the threshold voltage of such memory cell is less than the voltage level $V_{S4}$ having a minimum voltage value (i.e., located within a region 801), data “11111” or “100” is returned; if the threshold voltage of such memory cell falls between the voltage level $V_{S4}$ and the voltage level $V_{S2}$ (i.e., located within a region 802), data “01111” or “101” is returned; if the threshold voltage of such memory cell falls between the voltage level $V_{S2}$ and the voltage level $V_{S1}$ (i.e., located within a region 803), data “00111” or “111” is returned; if the threshold voltage of such memory cell falls between the voltage level $V_{S1}$ and the voltage level $V_{S3}$ (i.e., located within a region 804), data “00011” or “011” is returned; if the threshold voltage of such memory cell falls between the voltage level $V_{S3}$ and the voltage level $V_{S5}$ (i.e., located within a region 805), data “00001” or “001” is returned; and if the threshold voltage of such memory cell is higher than the voltage value $V_{S5}$ having a maximum voltage value (i.e., located within a region 806), data “00000” or “000” is returned.

In an exemplary embodiment, one of the default soft-decision voltage levels (e.g., the voltage level $V_{S3}$ in FIG. 8) may be equal to or approximate to the default hard-decision voltage level (e.g., the voltage level $V_{H1}$ in FIG. 7). A voltage difference between any two neighboring default soft-decision voltage levels may be the same default value.

In addition, a total number of the default soft-decision voltage levels may also be more (e.g., 7 or 9) or less (e.g., 3).

After the data is read based on the default soft-decision voltage levels (e.g., the voltage levels $V_{S1}$ to $V_{S5}$), the error checking and correcting circuit 508 decodes the data so as to attempt correcting possible errors in the data. Herein, the data read based on a plurality of soft-decision voltage levels is also known as soft-bit information (e.g., soft-bit information 831 including soft-bits $SB_1$ to $SB_5$ or soft-bit information 832 generated by performing a logical operation on a part of soft-bits, as shown in FIG. 8), and an operation of decoding the soft-bit information is also known as a soft-decoding operation. Those skilled in the art should be able to understand how the error checking and correcting circuit 508 uses the LDPC code or the like to perform the soft-decoding operation and what hardware structure is required by the error checking and correcting circuit 508 in order to complete the soft-decoding operation. For example, the soft-decoding operation may further include an operation of updating channel information, such as a log likelihood ratio (LLR). Further, the soft-decoding operation may include decoding operations identical to or different from at least a part of decoding operations used in the hard-decoding operation.

Particularly, because the soft-bit information corresponding to each of the memory cells can provide more channel information as compared to the hard-bit information, an error correcting capability of the soft-decoding operation is often higher than an error correcting capability of the hard-decoding operation. Then, the error checking and correcting circuit 508 determines whether the performed soft-decoding operation succeeds (or fails). If the soft-decoding operation succeeds (e.g., all errors in the data are corrected), the error checking and correcting circuit 508 can output successfully-decoded data.

If the soft-decoding operation still fails (e.g., errors in the data still cannot be completely corrected), the memory management circuit 502 sends a plurality of test command sequences to instruct reading the first memory cells based on a plurality of test voltage groups to obtain corresponding soft-bit information. Each of the test voltage groups includes a plurality of test voltage levels, and each of the test voltage groups (or the test voltage levels therein) correspond to one offset value. The offset value is, for example, recorded in a lookup table and configured to shift the default hard-decision voltage level (or the default soft-decision voltage levels) in order to generate the corresponding test voltage group. Further, a total number of the test voltage levels is the same in each of the test voltage groups.

According to the obtained soft-bit information, the memory management circuit 502 obtains a plurality of estimating parameters. Each of the estimating parameters corresponds to a total number of the memory cells matching a specific state condition among the first memory cells. According to the estimating parameters, the memory management circuit 502 can update the default hard-decision voltage level. For example, in the exemplary embodiment of FIG. 7, the default hard-decision voltage level may be updated from the voltage level $V_{H1}$ to a voltage level $V_{H2}$ according to the estimating parameters. In view of FIG. 7, it is highly possible that errors (e.g., a total number of error bits) included in the data read based on the voltage level $V_{H2}$ is significantly less than errors included in the data read based on the voltage level $V_{H1}$. Further, the operation of updating the default hard-decision voltage level from the voltage level $V_{H1}$ to the voltage level $V_{H2}$ may also be regarded as an operation of tracking an optimal read voltage level. In addition, in correspondence to the updated default hard-decision voltage level, the default soft-decision voltage levels may also be updated. For example, according to the obtained estimating parameters, the test voltage levels in the test voltage group corresponding to one specific offset value may be set as new default soft-decision voltage levels.

Figure 9A:
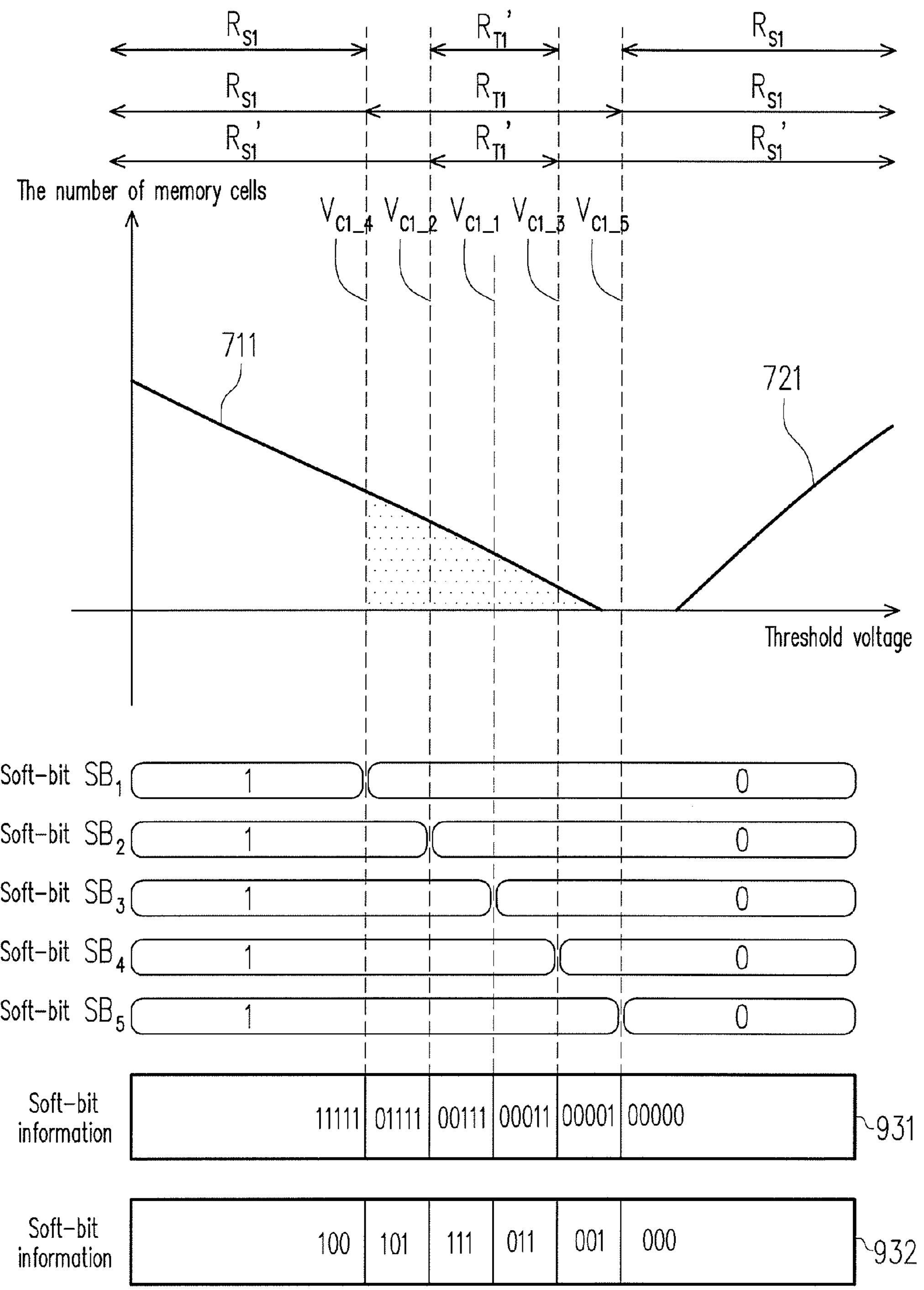
FIG. 9A to FIG. 9C illustrate schematic diagrams for tracing the optimal read voltage level according to an exemplary embodiment of the disclosure.
Figure 9B:
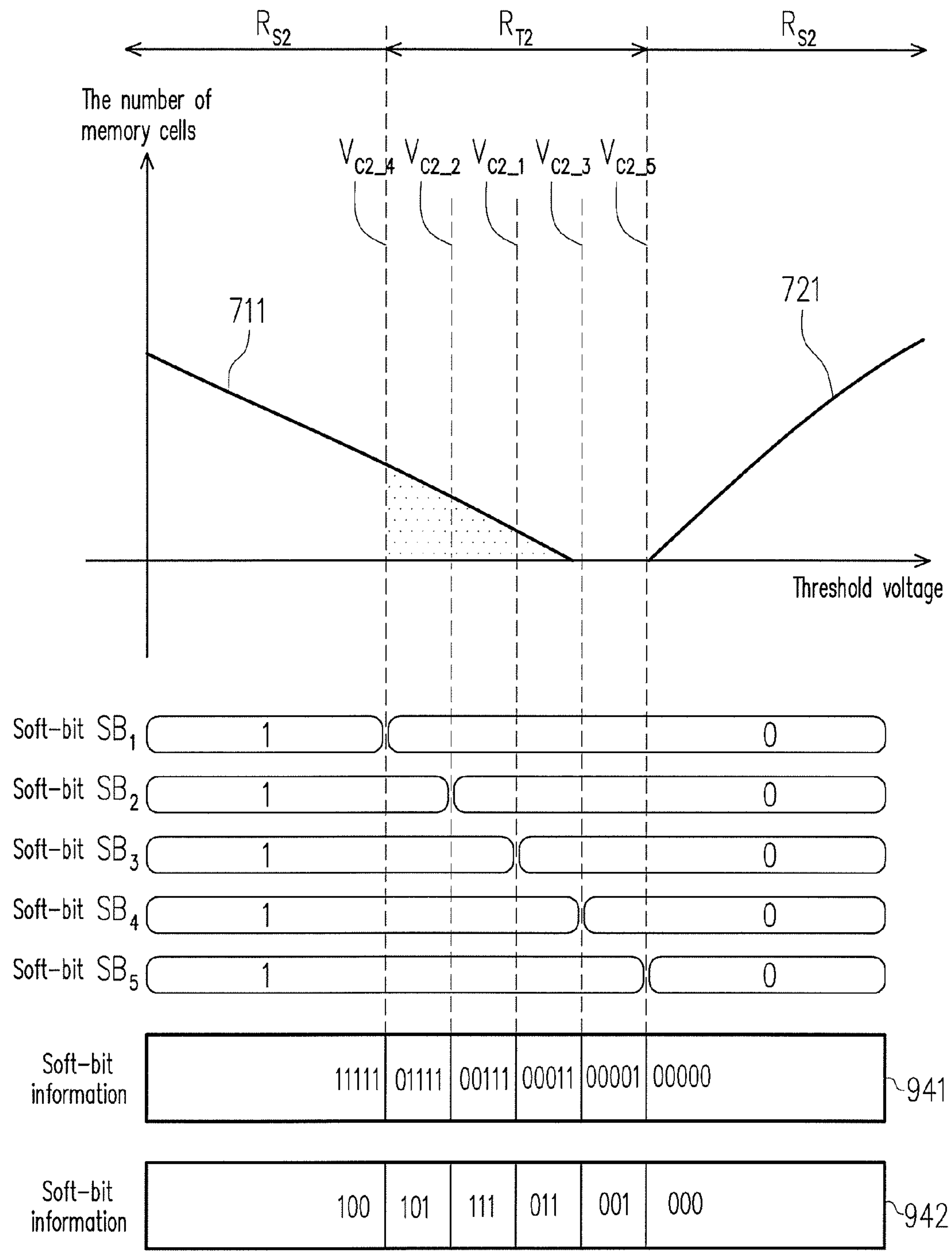
Figure 9C:
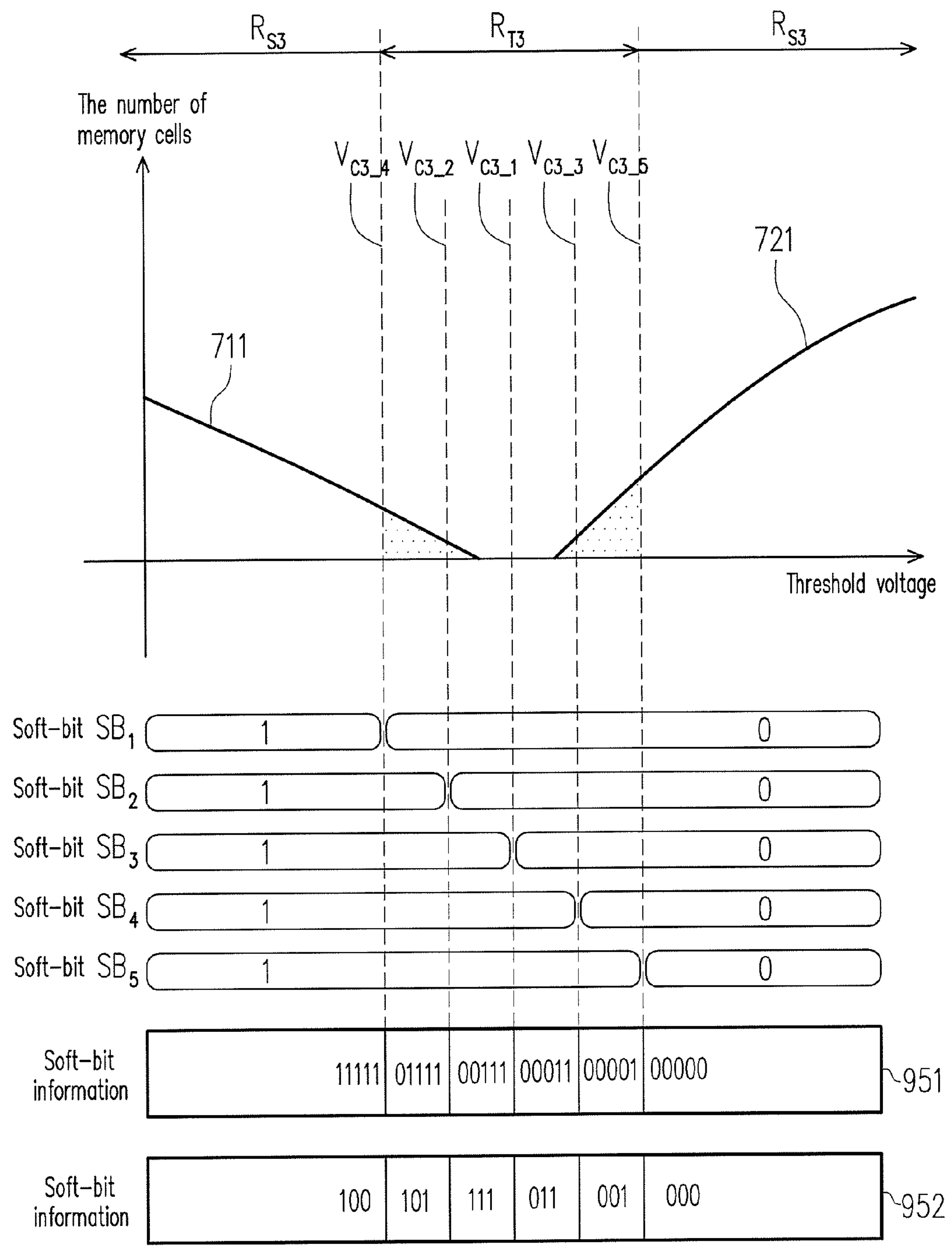

FIG. 9A to FIG. 9C illustrate schematic diagrams for tracing the optimal read voltage level according to an exemplary embodiment of the disclosure.

Referring to FIG. 9A, after the soft-decoding operation fails, the memory management circuit 502 can obtain one specific offset value according to the lookup table and obtain a plurality of test voltage levels (e.g., voltage levels $V_{C1\_1}$ to $V_{C1\_5}$) belonging to one specific test voltage group according to the specific offset value. Compared to the default soft-decision voltage levels (e.g., the voltage levels $V_{S1}$ to $V_{S5}$), each of the test voltage levels obtained according to the specific offset value (e.g., the voltage levels $V_{C1\_1}$ to $V_{C1\_5}$) shifts to the right by +Δ on the horizontal axis. For example, each of the voltage levels $V_{C1\_1}$ to $V_{C1\_5}$ increases by a voltage value of Δ(mV) as compared to respective one of the voltage levels $V_{S1}$ to $V_{S5}$. The memory management circuit 502 sends a test command sequence to instruct reading the first memory cells based on the voltage levels $V_{C1\_1}$ to $V_{C1\_5}$. Then, the memory management circuit 502 obtains corresponding soft-bit information 931 (or soft-bit information 932).

According to the soft-bit information 931 (or the soft-bit information 932), the memory management circuit 502 may count a total number of the memory cells each having a threshold voltage belonging to a transition state region among the first memory cells. Herein, the transition state region includes a region between any two of the voltage levels $V_{C1\_1}$ to $V_{C1\_5}$. In the present exemplary embodiment, the transition state region refers to a region $R_{T1}$ between a voltage level having a maximum voltage (i.e., the voltage level $V_{C1\_5}$) and a voltage level having a minimum voltage (i.e., the voltage level $V_{C1\_4}$) in the specific test voltage group. Alternatively, in another exemplary embodiment, the transition state region may also refer to a region $R_{T1'}$ between the voltage levels $V_{C1\_2}$ and $V_{C1\_3}$. For example, the memory management circuit 502 can obtain a total number of the memory cells each having a threshold voltage belonging to the region $R_{T1}$ by counting a total number of the memory cells corresponding to the soft-bit information "101", "111", "011" and "001". Alternatively, the memory management circuit 502 may also obtain a total number of the memory cells each having a threshold voltage belonging to the region $R_{T1'}$ by counting a total number of the memory cells corresponding to the soft-bit information "111" and "011". Then, the memory management circuit 502 can record the counted total number or one corresponding value to serve as the estimating parameter corresponding to the specific test voltage group (or the offset value +Δ).

Referring to FIG. 9B, the memory management circuit 502 can obtain another offset value according to the lookup table and obtain a plurality of test voltage levels (e.g., voltage levels $V_{C2\_1}$ to $V_{C2\_5}$) belonging to another test voltage group according to said another offset value. Compared to the voltage levels $V_{S1}$ to $V_{S5}$, each of the voltage levels $V_{C2\_1}$ to $V_{C2\_5}$ shifts to the right by +2Δ on the horizontal axis. For example, each of the voltage levels $V_{C2\_1}$ to $V_{C2\_5}$ increases by a voltage value of 2Δ(mV) as compared to respective one of the voltage levels $V_{S1}$ to $V_{S5}$. The memory management circuit 502 can send one test command sequence to instruct reading the first memory cells based on the voltage levels $V_{C2\_1}$ to $V_{C2\_5}$. Then, the memory management circuit 502 can obtain corresponding soft-bit information 941 (or soft-bit information 942).

According to the soft-bit information 941 (or the soft-bit information 942), the memory management circuit 502 can count a total number of the memory cells each having a threshold voltage belonging to a transition state region among the first memory cells. Herein, the transition state region includes a region between any two of the voltage levels $V_{C2\_1}$ to $V_{C2\_5}$. In the present exemplary embodiment, the memory management circuit 502 can obtain a total number of the memory cells each having a threshold voltage belonging to a region $R_{T2}$ (i.e., a region between the voltage levels $V_{C2\_4}$ and $V_{C2\_5}$) by counting a total number of the memory cells corresponding to the soft-bit information "101", "111", "011" and "001". Alternatively, in another exemplary embodiment, the memory management circuit 502 can obtain a total number of the memory cells each having a threshold voltage that falls between the voltage levels $V_{C2\_2}$ and $V_{C2\_3}$ by counting a total number of the memory cells corresponding to the soft-bit information "111" and "011". Then, the memory management circuit 502 can record the counted total number or one corresponding value to serve as the estimating parameter corresponding to said another test voltage group (or the offset value +2Δ).

Referring to FIG. 9C, the memory management circuit 502 may further obtain yet another offset value according to the lookup table and obtain a plurality of test voltage levels (e.g., voltage levels $V_{C3\_1}$ to $V_{C3\_5}$) belonging to yet another test voltage group according to said yet another offset value. Compared to the voltage levels $V_{S1}$ to $V_{S5}$, each of the voltage levels $V_{C3\_1}$ to $V_{C3\_5}$ shifts to the right by +3Δ on the horizontal axis. For example, each of the voltage levels $V_{C3\_1}$ to $V_{C3\_5}$ increases by a voltage value of 3Δ(mV) as compared to respective one of the voltage levels $V_{S1}$ to $V_{S5}$. The memory management circuit 502 can send one test command sequence to instruct reading the first memory cells based on the voltage levels $V_{C3\_1}$ to $V_{C3\_5}$ and obtains corresponding soft-bit information 951 (or soft-bit information 952).

According to the soft-bit information 951 (or the soft-bit information 952), the memory management circuit 502 can further count a total number of the memory cells each having a threshold voltage belonging to a transition state region among the first memory cells. Herein, the transition state region includes a region between any two of the voltage levels $V_{C3\_1}$ to $V_{C3\_5}$. In the present exemplary embodiment, the memory management circuit 502 can obtain a total number of the memory cells each having a threshold voltage belonging to a region $R_{T3}$ (i.e., a region between the voltage levels $V_{C3\_4}$ and $V_{C3\_5}$) by counting a total number of the memory cells corresponding to the soft-bit information "101", "111", "011" and "001". Alternatively, in another exemplary embodiment, the memory management circuit 502 can obtain a total number of the memory cells each having a threshold voltage that falls between the voltage levels $V_{C3\_2}$ and $V_{C3\_3}$ by counting a total number of the memory cells corresponding to the soft-bit information "111" and "011". Then, the memory management circuit 502 can record the counted total number or one corresponding value to serve as the estimating parameter corresponding to said yet another test voltage group (or the offset value +3Δ). In this way, in correspondence to more test voltage groups (or offset values +4Δ, −Δ, −2Δ, etc.), more estimating parameters may also be determined.

The memory management circuit 502 updates the default hard-decision voltage level according to a value relationship between the obtained estimating parameters. For example, if a value of the estimating parameter is positively correlated to the corresponding total number, the memory management circuit 502 can compare the obtained estimating parameters and select the offset value corresponding to the smallest one among the estimating parameters. Then, the memory management circuit 502 can update the default hard-decision voltage level according to the selected offset value.

FIG. 10A is a schematic diagram illustrating a correspondence relation between the number of the memory cells and the offset value according to an exemplary embodiment of the disclosure.

Referring to FIG. 10A, in the exemplary embodiments of FIG. 7 to FIG. 9C, the total number of the memory cells each having a threshold voltage belonging to the transition state region $R_{T1}$ is, for example, $N_1$; the total number of the memory cells each having a threshold voltage belonging to the transition state region $R_{T2}$ is, for example, $N_2$; and the total number of the memory cells each having a threshold voltage belonging to the transition state region $R_{T3}$ is, for example, $N_3$. $N_1$ corresponds to the offset value +Δ; $N_2$ corresponds to the offset value +2Δ; and $N_3$ corresponds to the offset value +3Δ. According to FIG. 9A, FIG. 9B and FIG. 9C, it can be known that $N_1$ is greater than $N_2$ and $N_2$ is greater than $N_3$. Therefore, the memory management circuit 502 can add 3Δ to $V_{H1}$ to obtain the voltage level $V_{H2}$. Further, in an exemplary embodiment, the memory management circuit 502 may also directly set the voltage level $V_{C3\_1}$ as the voltage level $V_{H2}$.

In an exemplary embodiment, the memory management circuit 502 can also count a total number of the memory cells each having a threshold voltage belonging to a stable state region among the first memory cells. Herein, the stable state region includes region(s) excluding a region between a voltage level having a maximum voltage and a voltage level having a minimum voltage in one specific test voltage group. Particularly, among multiple regions divided by the test voltage levels in the same test voltage group, the stable state region and the transition state region do not overlap with each other. For example, in an exemplary embodiment of FIG. 9A, the stable state region refers to regions $R_{S1}$ excluding the region $R_{T1}$. Alternatively, in another exemplary embodiment of FIG. 9A, the stable state region refers to regions $R_{S1}$ excluding the region $R_{T1'}$. Further, in another exemplary embodiment of FIG. 9A, the transition state region and the stable state region divided by the same test voltage group may also be the region $R_{T1'}$ and the regions $R_{S1}$, respectively, where one gap is provided between the region $R_{T1'}$ and its left and right regions $R_{S1}$, and these regions (e.g., region $R_{T1'}$ and regions $R_{S1}$) are not connected to one another. The memory management circuit 502 can count a total number of the memory cells each having a threshold voltage belonging to the regions $R_{S1}$ (or the regions $R_{S1'}$) to determine a corresponding estimating parameter. As another example, in an exemplary embodiment of FIG. 9B, the stable state region refers to regions $R_{S2}$ excluding the region $R_{T2}$. The memory management circuit 502 can count a total number of the memory cells each having a threshold voltage belonging to the region $R_{S2}$ to determine a corresponding estimating parameter. As another example, in an exemplary embodiment of FIG. 9C, the stable state region refers to regions $R_{S3}$ excluding the region $R_{T3}$. The memory management circuit 502 can count a total number of the memory cells each having a threshold voltage belonging to the region $R_{S3}$ to determine a corresponding estimating parameter. Then, the memory management circuit 502 can update the default hard-decision voltage level according to a value relationship between these estimating parameters. For example, if a value of the estimating parameter is positively correlated to the corresponding total number, the memory management circuit 502 can compare the obtained estimating parameters and select the offset value corresponding to the largest one among the estimating parameters. Then, the memory management circuit 502 can update the default hard-decision voltage level according to the selected offset value. In addition, the method of dividing the regions of FIG. 9A may also be applied to FIG. 9B and FIG. 9C, which is not particularly limited by the disclosure.

FIG. 10B is a schematic diagram illustrating a correspondence relation between the number of the memory cells and the offset value according to another exemplary embodiment of the disclosure.

Referring to FIG. 10B, in another exemplary embodiments of FIG. 7 to FIG. 9C, the total number of the memory cells each having the threshold voltage belonging to the stable state region $R_{S1}$ is, for example, $N_{1'}$; the total number of the memory cells each having the threshold voltage belonging to the stable state region $R_{S2}$ is, for example, $N_{2'}$; and the total number of the memory cells each having the threshold voltage belonging to the stable state region $R_{S3}$ is, for example, $N_{3'}$. $N_{1'}$ corresponds to the offset value $+\Delta$; $N_{2'}$ corresponds to the offset value $+2\Delta$; and $N_{3'}$ corresponds to the offset value $+3\Delta$. $N_{1'}$ is negatively correlated to $N_1$; $N_{2'}$ is negatively correlated to $N_2$; and $N_{3'}$ is negatively correlated to $N_3$. Thus, $N_{3'}$ is greater than $N_{2'}$ and $N_{2'}$ is greater than $N_{1'}$. Therefore, the memory management circuit 502 may add $3\Delta$ to $V_{H1}$ to obtain the voltage level $V_{H2}$.

After updating the default hard-decision voltage level, the memory management circuit 502 can send a read command sequence to instruct reading the first memory cells based on the updated default hard-decision voltage level to obtain the corresponding hard-bit information. For example, referring back to FIG. 7, the rewritable non-volatile memory module 406 can read the first memory cells based on the voltage level $V_{H2}$ and return the hard-bit information including a hard-bit $HB_2$. Compared to the hard-bit information read based on the voltage level $V_{H1}$, errors in the hard-bit information read based on the voltage level $V_{H2}$ may be significantly reduced. Then, the error checking and correcting circuit 508 can perform the hard-decoding operation on the hard-bit information and determine whether the decoding is successful. If the decoding is successful, the error checking and correcting circuit 508 can output successfully-decoded data. If the decoding still fails, the error checking and correcting circuit 508 can enter the soft-decoding mode again.

In the soft-decoding mode, the memory management circuit 502 can send a read command sequence to instruct reading the first memory cells based on a plurality of updated default soft-decision voltage levels to obtain the corresponding soft-bit information. For example, in the exemplary embodiments of FIG. 9A to FIG. 9C, the updated default soft-decision voltage levels may include all or at least one of the voltage levels $V_{C3\_1}$ to $V_{C3\_5}$ in FIG. 9C. The rewritable non-volatile memory module 406 can read the first memory cells based on the updated default soft-decision voltage levels and return the corresponding soft-bit information. Then, the error checking and correcting circuit 508 can perform the soft-decoding operation on the soft-bit information and determine whether the decoding is successful. If the soft-decoding operation is successful, the error checking and correcting circuit 508 can output successfully-decoded data. If the soft-decoding operation still fails, the error checking and correcting circuit 508 can determine that the entire decoding operation fails.

Figure 11:
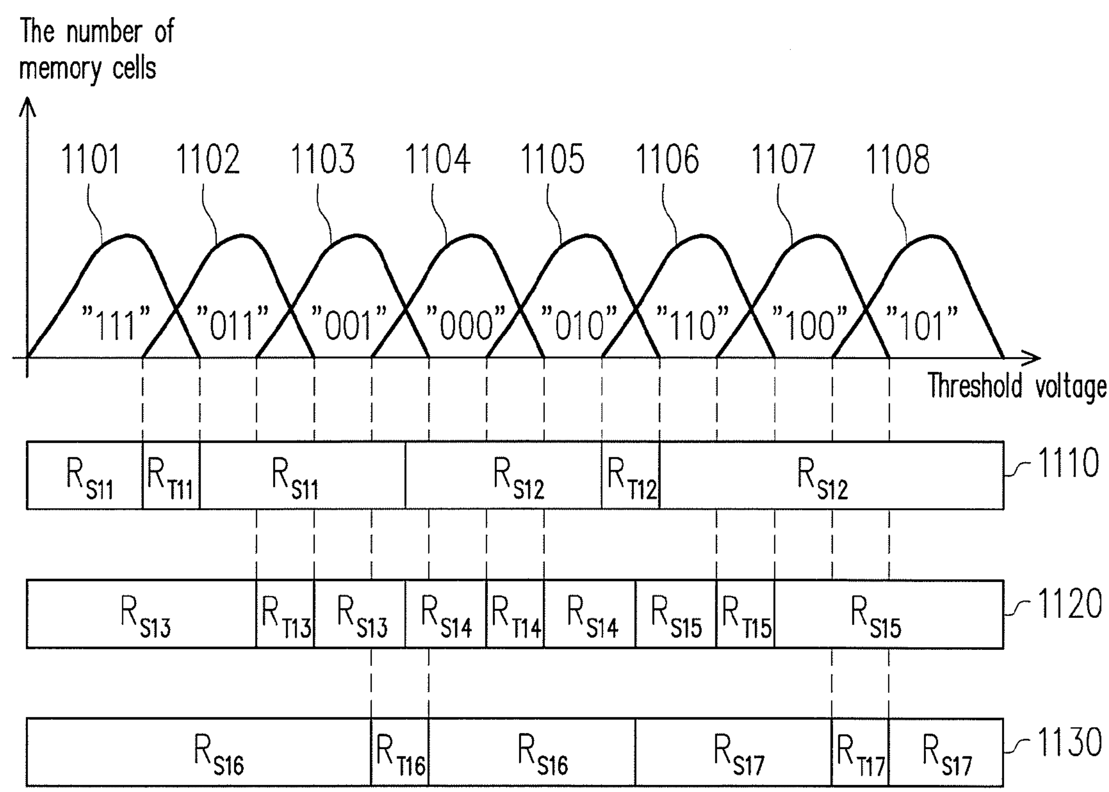
FIG. 11 is a schematic diagram illustrating the transition state regions and the stable state regions according to an exemplary embodiment of the disclosure.

FIG. 11 is a schematic diagram illustrating the transition state regions and the stable state regions according to an exemplary embodiment of the disclosure.

Referring to FIG. 11, for the TLC NAND flash memory, a threshold voltage distribution of the first memory cells may include distributions 1101 to 1108. The memory cells belonging to the distributions 1101 to 1108 are used to store a bit-set "111", "011", "001", "000", "010", "110", "100" and "101", respectively. For a lower physical programming unit 1110 including these memory cells (i.e., the physical unit regarded as storing the first bit in the bit-set), the transition state region include regions $R_{T11}$ and $R_{T12}$ and the stable state region includes regions $R_{S11}$ and $R_{S12}$. For an upper physical programming unit 1120 including these memory cells (i.e., the physical unit regarded as storing the second bit in the bit-set), the transition state region includes regions $R_{T13}$, $R_{T14}$ and $R_{T15}$ and the stable state region includes regions $R_{S13}$, $R_{S14}$ and $R_{S15}$. For an extra physical programming unit 1130 including these memory cells (i.e., the physical unit regarded as storing the third bit in the bit-set), the transition state region include regions $R_{T16}$ and $R_{T17}$ and the stable state region includes regions $R_{S16}$ and $R_{S17}$.

In the exemplary embodiment of FIG. 11, each transition state region (e.g., the region $R_{T11}$) and the corresponding stable state region (e.g., the region $R_{S11}$) may both include an upper limit and a lower limit of the threshold voltage. It is noted that, the distributions 711 and 721 in FIG. 7 to FIG. 9C may also be regarded as any two neighboring distributions (e.g., the distributions 1101 and 1102, 1102 and 1103, etc.) in FIG. 11. Further, since each transition state region and the corresponding stable state region are divided based on the applied test voltage level, each transition state region and the corresponding stable state region divided in FIG. 11 may shift to the right, shift to the left, become wider or become narrower, depending on the different test voltage groups. In addition, according to the exemplary embodiment of FIG. 11, those skilled in the art should understand how to divide the corresponding transition state region and stable state region based on the specific test voltage groups in the threshold voltage distributions for flash memory of other types (e.g., the MLC NAND flash memory), and thus description regarding the same is omitted hereinafter.

Figure 12:
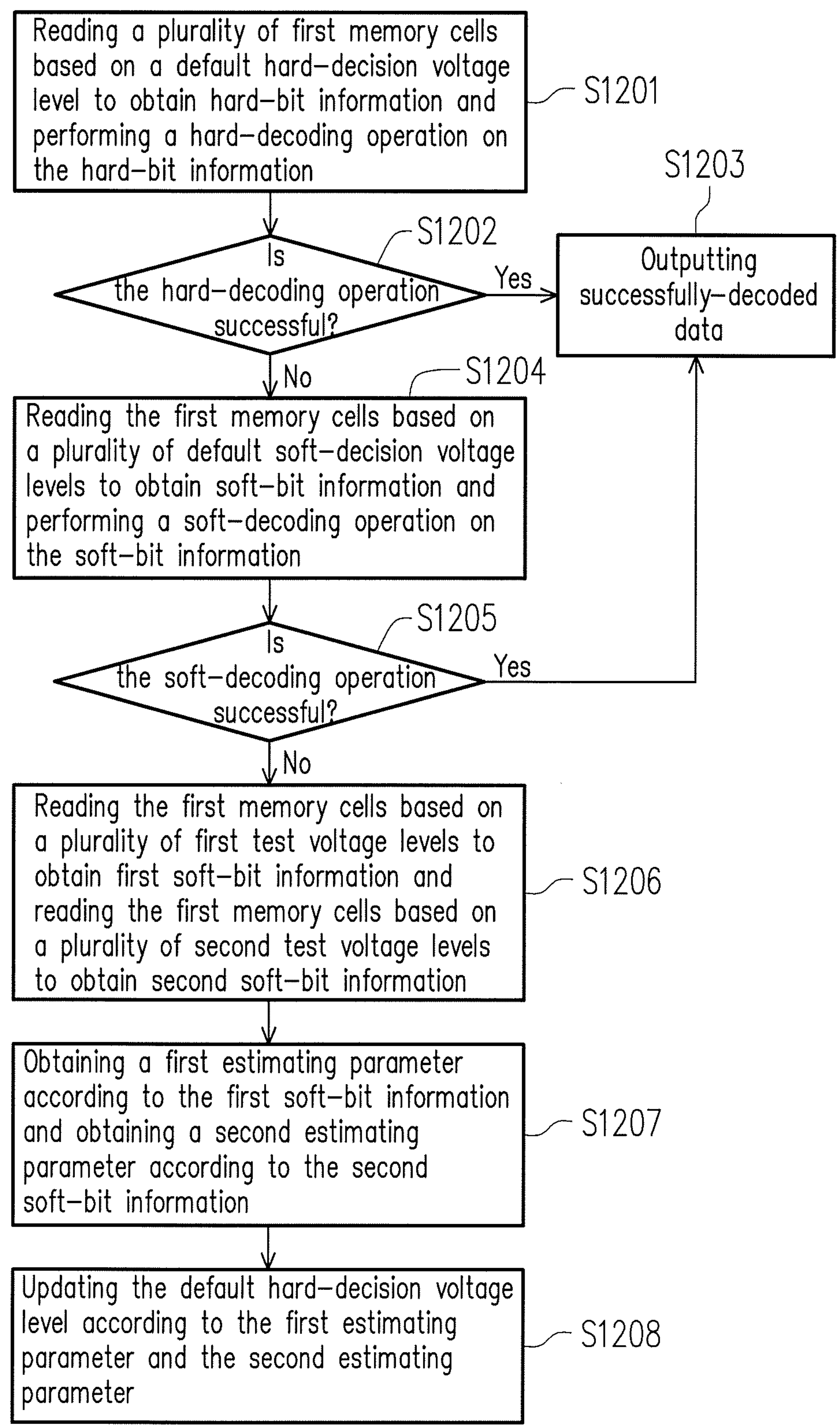
FIG. 12 is a flowchart illustrating a decoding method according to an exemplary embodiment of the disclosure.

FIG. 12 is a flowchart illustrating a decoding method according to an exemplary embodiment of the disclosure.

Referring to FIG. 12, in step S1201, a plurality of first memory cells is read based on a default hard-decision voltage level to obtain hard-bit information and a hard-decoding operation is performed on the hard-bit information. In step S1202, whether the hard-decoding operation succeeds (or fails) is determined. If the hard-decoding operation succeeds, in step S1203, a successfully-decoded data (or codeword) is outputted. If the hard-decoding operation fails, in step S1204, the first memory cells are read based on a plurality of default soft-decision voltage levels to obtain soft-bit information and a soft-decoding operation is performed on the soft-bit information. In step S1205, whether the soft-decoding operation succeeds (or fails) is determined. If the soft-decoding operation succeeds, in step S1203, the successfully-decoded data is outputted. If the soft-decoding operation fails, in step S1206, the first memory cells are read based on a plurality of first test voltage levels to obtain first soft-bit information and the first memory cells are read based on a plurality of second test voltage levels to obtain second soft-bit information. In step S1207, a first estimating parameter is obtained according to the first soft-bit information and a second estimating parameter is obtained according to the second soft-bit information. In step S1208, the default hard-decision voltage level is updated according to the first estimating parameter and the second estimating parameter.

Figure 13:
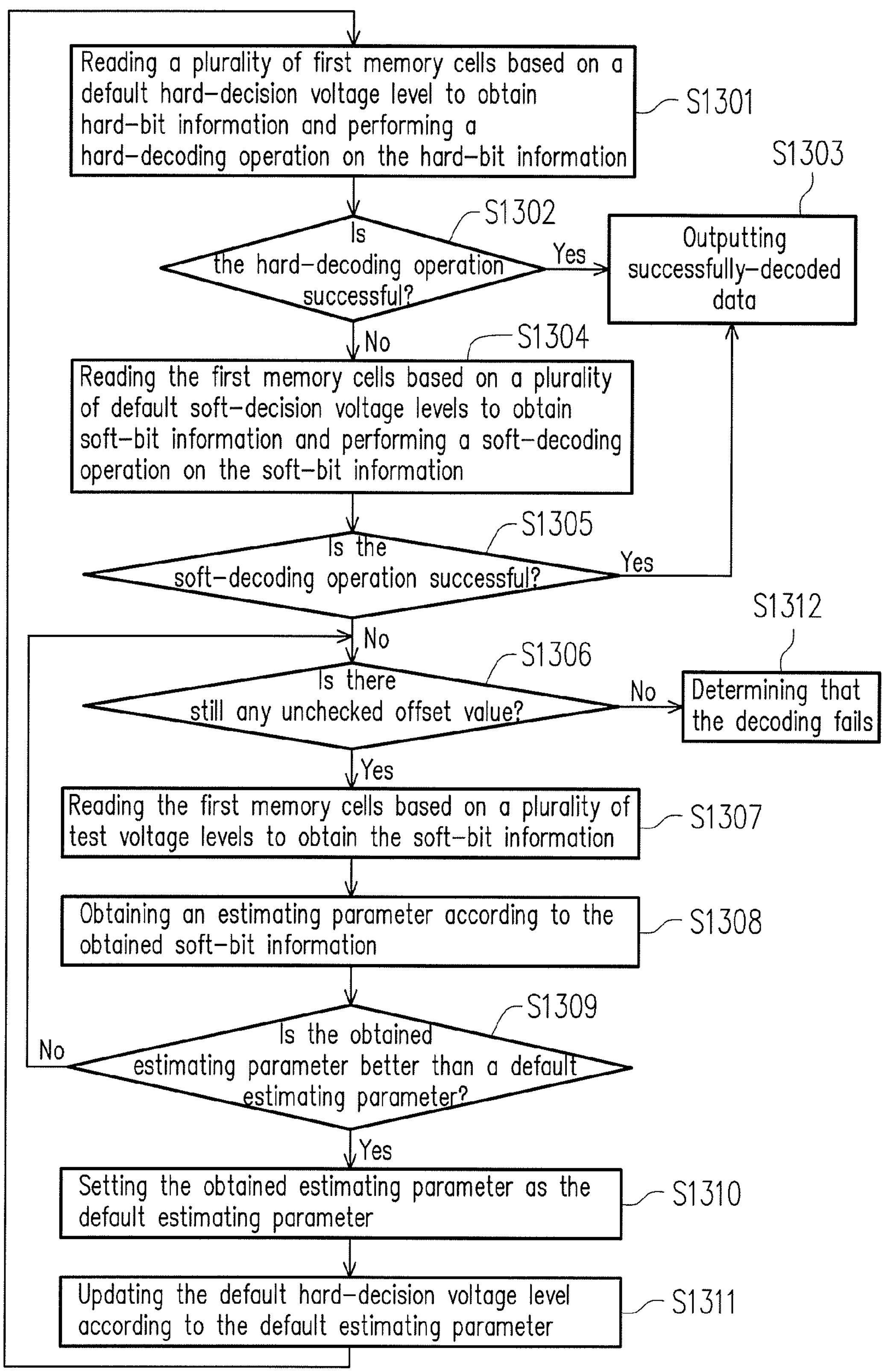
FIG. 13 is a flowchart illustrating a decoding method according to another exemplary embodiment of the disclosure.

FIG. 13 is a flowchart illustrating a decoding method according to another exemplary embodiment of the disclosure.

Referring to FIG. 13, in step S1301, a plurality of first memory cells is read based on a default hard-decision voltage level to obtain hard-bit information and a hard-decoding operation is performed on the hard-bit information. In step S1302, whether the hard-decoding operation succeeds (or fails) is determined. If the hard-decoding operation is successful, in step S1303, a successfully-decoded data (e.g., codeword) is outputted. If the hard-decoding operation fails, in step S1304, the first memory cells are read based on a plurality of default soft-decision voltage levels to obtain soft-bit information and a soft-decoding operation is performed on the soft-bit information. In step S1305, whether the soft-decoding operation succeeds (or fails) is determined. If the soft-decoding operation is successful, in step S1303, the successfully-decoded data is outputted. If the soft-decoding operation fails, in step S1306, whether there is still any unchecked offset value is determined. If there is still any unchecked offset value, in step S1307, the first memory cells are read based on a plurality of test voltage levels to obtain the soft-bit information. For example, the test voltage levels correspond to one specific offset value selected for checking.

In step S1308, an estimating parameter is obtained according to the soft-bit information obtained in step S1307. In step S1309, whether the estimating parameter obtained in step S1308 is better than a default estimating parameter is determined. For example, if a value of an estimating parameter is positively correlated to a total number of the memory cells each having a threshold voltage belonging to a transition state region and the obtained estimating parameter is less than the default estimating parameter, a result of step S1309 is determined as "Yes" and the method proceeds to step S1310 in which the obtained estimating parameter is set as the default estimating parameter. Conversely, if the value of the estimating parameter is positively correlated to the total number of the memory cells each having the threshold voltage belonging to the transition state region and the estimating parameter is greater than the default estimating parameter, the result of step S1309 may be determined as "No" and the method goes back to step S1306. After the method returned to step S1306, a next offset value may be checked (e.g., a plurality of test voltage levels is determined according to the next offset value). It is noted that, in the case where step S1307 is performed for the very first time (i.e., the default estimating parameter is never set), the estimating parameter obtained in step S1308 may be directly set as the default estimating parameter in step S1310.

In step S1311, the default hard-decision voltage level is updated according to the default estimating parameter. For example, the default hard-decision voltage level may be set as an optimal read voltage level according to the offset value corresponding to the default estimating parameter. Thereafter, step S1301 and the steps so forth are repeatedly performed, and the related description is not repeated hereinafter. Further, after many more offset values are checked, if all the offset values are checked (i.e., all the estimating parameters corresponding all usable offset value have been obtained) when step S1306 is performed again, it is determined that the entire decoding operation fails in step S1312. For example, if the error checking and correcting circuit 508 determines that the entire decoding operation fails, the memory management circuit 502 can send a read failure message to the host system 11.

Figure 14:
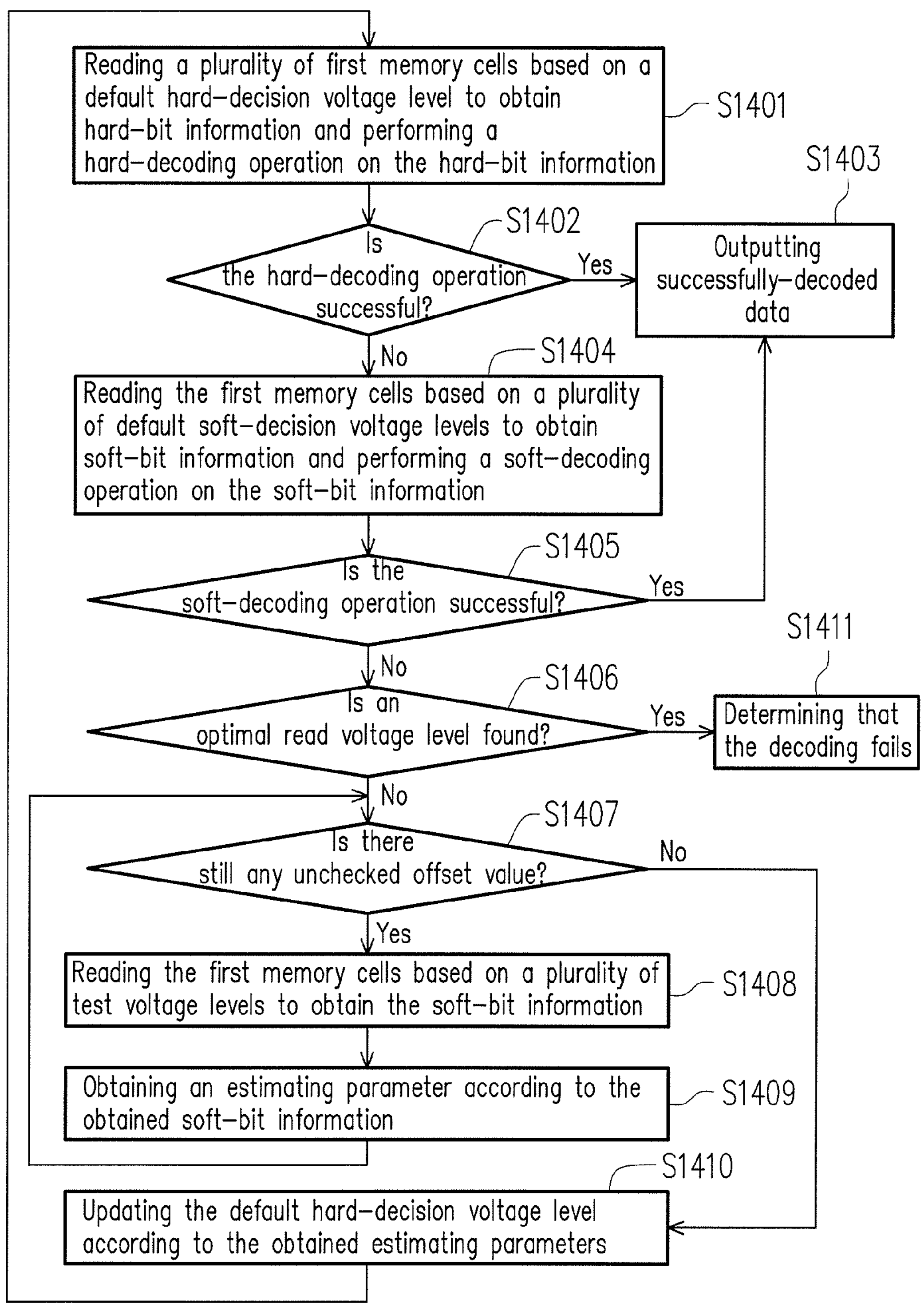
FIG. 14 is a flowchart illustrating a decoding method according to another exemplary embodiment of the disclosure.

FIG. 14 is a flowchart illustrating a decoding method according to another exemplary embodiment of the disclosure.

Referring to FIG. 14, in step S1401, a plurality of first memory cells are read based on a default hard-decision voltage level to obtain hard-bit information and a hard-decoding operation is performed on the hard-bit information. In step S1402, whether the hard-decoding operation succeeds (or fails) is determined. If the hard-decoding operation is successful, in step S1403, a successfully-decoded data (e.g., codeword) is outputted. If the hard-decoding operation fails, in step S1404, the first memory cells are read based on a plurality of default soft-decision voltage levels to obtain soft-bit information and a soft-decoding operation is performed on the soft-bit information. In step S1405, whether the soft-decoding operation succeeds (or fails) is determined. If the soft-decoding operation is successful, in step S1403, the successfully-decoded data is outputted. If the soft-decoding operation fails, in step S1406, whether an optimal read voltage level is found is determined. If not, in step S1407, whether there is still any unchecked offset value is determined.

If there is still any unchecked offset value, in step S1408, the first memory cells are read based on a plurality of test voltage levels to obtain the soft-bit information. For example, the test voltage levels correspond to one specific offset value selected for checking. In step S1409, an estimating parameter is obtained according to the soft-bit information obtained in step S1408. Then, the method goes back to step S1407 in which whether there is still any unchecked offset value is determined again. If yes, steps S1408 and S1409 are repeatedly performed. If it is determined that all offset values have been checked (i.e., all the estimating parameters corresponding all usable offset value have been obtained) in step S1407, the default hard-decision voltage level is updated according to the obtained estimating parameters in step S1410. For example, one specific offset value may be selected according to a value relationship between the estimating parameters, and the optimal read voltage level may be set according to the specific offset value. Operations regarding how to select the offset value according to the value relationship between the estimating parameters and set the optimal read voltage level have been described in detail in the foregoing embodiments, which are not repeated hereinafter. After step S1410 is performed, step S1401 and the steps so forth are repeatedly performed. In addition, when step S1406 is performed again, because the optimal read voltage level has been used in step S1401 repeatedly performed, it is determined that the entire decoding operation fails in step S1411.

Nevertheless, each of steps depicted in FIG. 12 to FIG. 14 have been described in detail as above, and thus related description is not repeated hereinafter. It should be noted that, the steps depicted in FIG. 12 to FIG. 14 may be implemented as a plurality of program codes or circuits, which are not particularly limited in the disclosure. Moreover, the methods disclosed in FIG. 12 to FIG. 14 may be implemented with reference to above embodiments, or may be implemented separately, which are not particularly limited in the disclosure.

In summary, after the soft-decoding operation fails, at least two groups of test voltage levels are used to read the same memory cells. Then, the corresponding estimating parameters are obtained, where each of the estimating parameters corresponds to the total number of the memory cells matching one specific state condition among the memory cells. Then, the default hard-decision voltage level may be updated according to the estimating parameters. As a result, the efficiency for searching the optimal read voltage level may be improved in the decoding operation to further improve the decoding efficiency.

The previously described exemplary embodiments of the present disclosure have the advantages aforementioned, wherein the advantages aforementioned not required in all versions of the disclosure. It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A decoding method for a memory storage device comprising a rewritable non-volatile memory module which comprises a plurality of memory cells, the decoding method comprising:

generating, by a memory management circuit, a first read command sequence to instruct reading a plurality of first memory cells among the memory cells based on a default hard-decision voltage level to obtain hard-bit information and sending the first read command sequence via a memory interface;

performing, by an error checking and correcting circuit, a hard-decoding operation on the hard-bit information;

generating, by the memory management circuit, a second read command sequence to instruct reading the first memory cells based on a plurality of default soft-decision voltage levels to obtain soft-bit information and sending the second read command sequence via the memory interface when the hard-decoding operation fails;

performing, by the error checking and correcting circuit, a soft-decoding operation on the soft-bit information;

generating, by the memory management circuit, a first test command sequence to instruct reading the first memory cells based on a plurality of first test voltage levels to obtain first soft-bit information and a second test command sequence to instruct reading the first memory cells based on a plurality of second test voltage levels to obtain second soft-bit information and sending the first test command sequence and the second test command sequence via the memory interface when the soft-decoding operation fails;

obtaining, by the memory management circuit, a first estimating parameter according to the first soft-bit information and obtaining, by the memory management circuit, a second estimating parameter according to the second soft-bit information, wherein the first estimating parameter corresponds to a first total number of a memory cell matching a first state condition among the first memory cells, wherein the second estimating parameter corresponds to a second total number of a memory cell matching a second state condition among the first memory cells; and updating, by the memory management circuit, the default hard-decision voltage level according to the first estimating parameter and the second estimating parameter.

2. The decoding method of claim 1, wherein the step of obtaining the first estimating parameter according to the first soft-bit information and obtaining the second estimating parameter according to the second soft-bit information comprises:

counting a total number of a memory cell having a threshold voltage belonging to a first transition state region among the first memory cells according to the first soft-bit information, wherein the first transition state region comprises a region between any two voltage levels among the first test voltage levels; and counting a total number of a memory cell having a threshold voltage belonging to a second transition state region among the first memory cells according to the second soft-bit information, wherein the second transition state region comprises a region between any two voltage levels among the second test voltage levels.

3. The decoding method of claim 2, wherein the first transition state region is a region between a voltage level having a maximum voltage among the first test voltage levels and a voltage level having a minimum voltage among the first test voltage levels, wherein the second transition state region is a region between a voltage level having a maximum voltage among the second test voltage levels and a voltage level having a minimum voltage among the second test voltage levels.

4. The decoding method of claim 1, wherein the step of obtaining the first estimating parameter according to the first soft-bit information and obtaining the second estimating parameter according to the second soft-bit information comprises:

counting a total number of a memory cell having a threshold voltage belonging to a first stable state region among the first memory cells according to the first soft-bit information, wherein the first stable state region comprises a region excluding a region between a voltage level having a maximum voltage and a voltage level having a minimum voltage among the first test voltage levels; and counting a total number of a memory cell having a threshold voltage belonging to a second stable state region among the first memory cells according to the second soft-bit information, wherein the second stable state region comprises a region excluding a region between a voltage level having a maximum voltage and a voltage level having a minimum voltage among the second test voltage levels.

5. The decoding method of claim 4, wherein the first stable state region is located outside the region between the voltage level having the maximum voltage and the voltage level having the minimum voltage among the first test voltage levels, wherein the second stable state region is located outside the region between the voltage level having the maximum voltage and the voltage level having the minimum voltage among the second test voltage levels.

6. The decoding method of claim 1, wherein the first test voltage levels correspond to a first offset value, wherein the second test voltage levels correspond to a second offset value, wherein the first offset value is different from the second offset value, wherein the step of updating the default hard-decision voltage level according to the first estimating parameter and the second estimating parameter comprises:

updating the default hard-decision voltage level according to a value relationship between the first total number and the second total number, wherein the updated default hard-decision voltage level corresponds to one of the first offset value and the second offset value.

7. The decoding method of claim 6, further comprising:

updating the default soft-decision voltage levels according to the value relationship between the first total number and the second total number, wherein the updated default soft-decision voltage levels correspond to the one of the first offset value and the second offset value.

8. A memory storage device, comprising:

a connection interface unit, configured to couple to a host system;

a rewritable non-volatile memory module comprising a plurality of memory cells; and a memory control circuit unit, coupled to the connection interface unit and the rewritable non-volatile memory module, wherein the memory control circuit unit is configured to send a first read command sequence to instruct reading a plurality of first memory cells among the memory cells based on a default hard-decision voltage level to obtain hard-bit information, wherein the memory control circuit unit is further configured to perform a hard-decoding operation on the hard-bit information, wherein the memory control circuit unit is further configured to send a second read command sequence to instruct reading the first memory cells based on a plurality of default soft-decision voltage levels to obtain soft-bit information when the hard-decoding operation fails, wherein the memory control circuit unit is further configured to perform a soft-decoding operation on the soft-bit information, wherein the memory control circuit unit is further configured to send a first test command sequence to instruct reading the first memory cells based on a plurality of first test voltage levels to obtain first soft-bit information and send a second test command sequence to instruct reading the first memory cells based on a plurality of second test voltage levels to obtain second soft-bit information when the soft-decoding operation fails, wherein the memory control circuit unit is further configured to obtain a first estimating parameter according to the first soft-bit information and obtain a second estimating parameter according to the second soft-bit information, wherein the first estimating parameter corresponds to a first total number of a memory cell matching a first state condition among the first memory cells, wherein the second estimating parameter corresponds to a second total number of a memory cell matching a second state condition among the first memory cells, wherein the memory control circuit unit is further configured to update the default hard-decision voltage level according to the first estimating parameter and the second estimating parameter.

9. The memory storage device of claim 8, wherein the operation of obtaining the first estimating parameter according to the first soft-bit information and obtaining the second estimating parameter according to the second soft-bit information by the memory control circuit unit comprises:

counting a total number of a memory cell having a threshold voltage belonging to a first transition state region among the first memory cells according to the first soft-bit information, wherein the first transition state region includes a region between any two voltage levels among the first test voltage levels; and counting a total number of a memory cell having a threshold voltage belonging to a second transition state region among the first memory cells according to the second soft-bit information, wherein the second transition state region includes a region between any two voltage levels among the second test voltage levels.

10. The memory storage device of claim 9, wherein the first transition state region is a region between a voltage level having a maximum voltage among the first test voltage levels and a voltage level having a minimum voltage among the first test voltage levels, wherein the second transition state region is a region between a voltage level having a maximum voltage among the second test voltage levels and a voltage level having a minimum voltage among the second test voltage levels.

11. The memory storage device of claim 8, wherein the operation of obtaining the first estimating parameter according to the first soft-bit information and obtaining the second estimating parameter according to the second soft-bit information by the memory control circuit unit comprises:

counting a total number of a memory cell having a threshold voltage belonging to a first stable state region among the first memory cells according to the first soft-bit information, wherein the first stable state region includes a region excluding a region between a voltage level having a maximum voltage and a voltage level having a minimum voltage among the first test voltage levels; and counting a total number of a memory cell having a threshold voltage belonging to a second stable state region among the first memory cells according to the second soft-bit information, wherein the second stable state region includes a region excluding a region between a voltage level having a maximum voltage and a voltage level having a minimum voltage among the second test voltage levels.

12. The memory storage device of claim 11, wherein the first stable state region is located outside the region between the voltage level having the maximum voltage and the voltage level having the minimum voltage among the first test voltage levels, wherein the second stable state region is located outside the region between the voltage level having the maximum voltage and the voltage level having the minimum voltage among the second test voltage levels.

13. The memory storage device of claim 8, wherein the first test voltage levels correspond to a first offset value, wherein the second test voltage levels correspond to a second offset value, wherein the first offset value is different from the second offset value, wherein the operation of updating the default hard-decision voltage level according to the first estimating parameter and the second estimating parameter by the memory control circuit unit comprises:

updating the default hard-decision voltage level according to a value relationship between the first total number and the second total number, wherein the updated default hard-decision voltage level corresponds to one of the first offset value and the second offset value.

14. The memory storage device of claim 13, wherein the memory control circuit unit is further configured to update the default soft-decision voltage levels according to the value relationship between the first total number and the second total number, wherein the updated default soft-decision voltage levels correspond to the one of the first offset value and the second offset value.

15. A memory control circuit unit for controlling a rewritable non-volatile memory module comprising a plurality of memory cells, wherein the memory control circuit unit comprises:

a host interface, configured to couple to a host system;

a memory interface, configured to couple to the rewritable non-volatile memory module;

an error checking and correcting circuit; and a memory management circuit, coupled to the host interface, the memory interface and the error checking and correcting circuit, wherein the memory management circuit is configured to send a first read command sequence to instruct reading a plurality of first memory cells among the memory cells based on a default hard-decision voltage level to obtain hard-bit information, wherein the error checking and correcting circuit is configured to perform a hard-decoding operation on the hard-bit information, wherein the memory management circuit is further configured to send a second read command sequence to instruct reading the first memory cells based on a plurality of default soft-decision voltage levels to obtain soft-bit information when the hard-decoding operation fails, wherein the error checking and correcting circuit is further configured to perform a soft-decoding operation on the soft-bit information, wherein the memory management circuit is further configured to send a first test command sequence to instruct reading the first memory cells based on a plurality of first test voltage levels to obtain first soft-bit information and send a second test command sequence to instruct reading the first memory cells based on a plurality of second test voltage levels to obtain second soft-bit information when the soft-decoding operation fails, wherein the memory management circuit is further configured to obtain a first estimating parameter according to the first soft-bit information and obtain a second estimating parameter according to the second soft-bit information, wherein the first estimating parameter corresponds to a first total number of a memory cell matching a first state condition among the first memory cells, wherein the second estimating parameter corresponds to a second total number of a memory cell matching a second state condition among the first memory cells, wherein the memory management circuit is further configured to update the default hard-decision voltage level according to the first estimating parameter and the second estimating parameter.

16. The memory control circuit unit of claim 15, wherein the operation of obtaining the first estimating parameter according to the first soft-bit information and obtaining the second estimating parameter according to the second soft-bit information by the memory management circuit comprises:

counting a total number of a memory cell having a threshold voltage belonging to a first transition state region among the first memory cells according to the first soft-bit information, wherein the first transition state region comprises a region between any two voltage levels among the first test voltage levels; and counting a total number of a memory cell having a threshold voltage belonging to a second transition state region among the first memory cells according to the second soft-bit information, wherein the second transition state region comprises a region between any two voltage levels among the second test voltage levels.

17. The memory control circuit unit of claim 16, wherein the first transition state region is a region between a voltage level having a maximum voltage among the first test voltage levels and a voltage level having a minimum voltage among the first test voltage levels, wherein the second transition state region is a region between a voltage level having a maximum voltage among the second test voltage levels and a voltage level having a minimum voltage among the second test voltage levels.

18. The memory control circuit unit of claim 15, wherein the operation of obtaining the first estimating parameter according to the first soft-bit information and obtaining the second estimating parameter according to the second soft-bit information by the memory management circuit comprises:

counting a total number of a memory cell having a threshold voltage belonging to a first stable state region among the first memory cells according to the first soft-bit information, wherein the first stable state region comprises a region excluding a region between a voltage level having a maximum voltage and a voltage level having a minimum voltage among the first test voltage levels; and counting a total number of a memory cell having a threshold voltage belonging to a second stable state region among the first memory cells according to the second soft-bit information, wherein the second stable state region comprises a region excluding a region between a voltage level having a maximum voltage and a voltage level having a minimum voltage among the second test voltage levels.

19. The memory control circuit unit of claim 18, wherein the first stable state region is located outside the region between the voltage level having the maximum voltage and the voltage level having the minimum voltage among the first test voltage levels, wherein the second stable state region is located outside the region between the voltage level having the maximum voltage and the voltage level having the minimum voltage among the second test voltage levels.

20. The memory control circuit unit of claim 15, wherein the first test voltage levels correspond to a first offset value, wherein the second test voltage levels correspond to a second offset value, wherein the first offset value is different from the second offset value, wherein the operation of updating the default hard-decision voltage level according to the first estimating parameter and the second estimating parameter by the memory management circuit comprises:

updating the default hard-decision voltage level according to a value relationship between the first total number and the second total number, wherein the updated default hard-decision voltage level corresponds to one of the first offset value and the second offset value.

21. The memory control circuit unit of claim 20, wherein the memory management circuit is further configured to update the default soft-decision voltage levels according to the value relationship between the first total number and the second total number, wherein the updated default soft-decision voltage levels correspond to the one of the first offset value and the second offset value.

* * * * *